(12) United States Patent
Lin et al.

(10) Patent No.: US 11,430,729 B2
(45) Date of Patent: Aug. 30, 2022

(54) MIM CAPACITOR WITH A SYMMETRICAL CAPACITOR INSULATOR STRUCTURE

(71) Applicant: Taiwan Semiconductor Manufacturing Co., Ltd., Hsinchu (TW)

(72) Inventors: Hsing-Lien Lin, Hsin-Chu (TW); Cheng-Te Lee, Chupei (TW); Rei-Lin Chu, Hsinchu (TW); Chii-Ming Wu, Taipei (TW); Yeur-Luen Tu, Taichung (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/022,320

(22) Filed: Sep. 16, 2020

(65) Prior Publication Data

US 2022/0084935 A1 Mar. 17, 2022

(51) Int. Cl.
*H01L 23/522* (2006.01)
*H01L 27/08* (2006.01)
*H01L 49/02* (2006.01)
*H01L 21/02* (2006.01)

(52) U.S. Cl.
CPC ........ *H01L 23/5223* (2013.01); *H01L 21/022* (2013.01); *H01L 27/0805* (2013.01); *H01L 28/56* (2013.01); *H01L 28/75* (2013.01)

(58) Field of Classification Search
CPC . H01L 23/5223; H01L 27/0805; H01L 28/56; H01L 28/75; H01L 21/022; H01L 21/02189; H01L 21/02175
See application file for complete search history.

(56) References Cited

U.S. PATENT DOCUMENTS

| 5,514,908 A | 5/1996 | Liao et al. |
| 6,355,571 B1 | 3/2002 | Huang |
| 6,774,048 B2 | 8/2004 | Baek |

(Continued)

FOREIGN PATENT DOCUMENTS

| KR | 20080084434 A | 9/2008 |
| KR | 20080098824 A | 11/2008 |
| KR | 20100078496 A | 7/2010 |

OTHER PUBLICATIONS

Non Final Office Action dated Dec. 24, 2020 in connection with U.S. Appl. No. 16/579,738.

(Continued)

*Primary Examiner* — Ahmed N Sefer
(74) *Attorney, Agent, or Firm* — Eschweiler & Potashnik, LLC

(57) ABSTRACT

Various embodiments of the present application are directed towards a metal-insulator-metal (MIM) capacitor. The MIM capacitor comprises a bottom electrode disposed over a semiconductor substrate. A top electrode is disposed over and overlies the bottom electrode. A capacitor insulator structure is disposed between the bottom electrode and the top electrode. The capacitor insulator structure comprises at least three dielectric structures vertically stacked upon each other. A bottom half of the capacitor insulator structure is a mirror image of a top half of the capacitor insulator structure in terms of dielectric materials of the dielectric structures.

20 Claims, 15 Drawing Sheets

(56) References Cited

U.S. PATENT DOCUMENTS

| | | | |
|---|---|---|---|
| 6,885,056 B1* | 4/2005 | Dornisch | H01L 28/40 257/310 |
| 7,232,757 B2 | 6/2007 | Noguchi | |
| 7,504,674 B2 | 3/2009 | Farrar | |
| 7,601,648 B2 | 10/2009 | Chua | |
| 10,243,128 B2 | 3/2019 | Hayashi | |
| 10,593,777 B2 | 3/2020 | Kim | |
| 10,847,316 B2* | 11/2020 | Lee | H01L 27/0805 |
| 2002/0115275 A1* | 8/2002 | Choi | H01L 21/02186 438/584 |
| 2004/0144311 A1 | 7/2004 | Chen | |
| 2006/0040457 A1 | 2/2006 | Lee et al. | |
| 2006/0151852 A1* | 7/2006 | Senzaki | H01L 28/40 257/532 |
| 2007/0252244 A1* | 11/2007 | Srividya | H01L 21/02194 257/635 |
| 2010/0255651 A1 | 10/2010 | Kang et al. | |
| 2011/0227143 A1* | 9/2011 | Lee | H01L 27/10808 257/325 |
| 2012/0088360 A1* | 4/2012 | Kim | H01L 29/42324 438/592 |
| 2012/0156854 A1* | 6/2012 | Chen | H01L 21/02189 438/393 |
| 2012/0309160 A1 | 12/2012 | Ramini et al. | |
| 2013/0270676 A1 | 10/2013 | Lindert et al. | |
| 2014/0017508 A1 | 1/2014 | Lee | |
| 2015/0001673 A1 | 1/2015 | Li et al. | |
| 2015/0137315 A1 | 5/2015 | Chen et al. | |
| 2015/0179730 A1* | 6/2015 | Hashim | H01L 28/40 257/532 |
| 2015/0262812 A1 | 9/2015 | Liu et al. | |
| 2015/0318343 A1* | 11/2015 | Kim | H01L 21/768 438/396 |
| 2016/0163781 A1 | 6/2016 | Lin et al. | |
| 2017/0117282 A1 | 4/2017 | Mathur et al. | |
| 2020/0020780 A1* | 1/2020 | Kim | H01L 27/10814 |
| 2020/0091279 A1* | 3/2020 | Moon | H01L 21/02189 |
| 2020/0279601 A1 | 9/2020 | Kim et al. | |
| 2020/0335333 A1* | 10/2020 | Kang | H01L 21/02181 |

OTHER PUBLICATIONS

Notice of Allowance dated Jun. 17, 2021 in connection with U.S. Appl. No. 16/579,738.

Pittenger et al. "Quantitative Mechanical Property Mapping at the Nanoscale with PeakForce QNM " Bruker Nano Surfaces Divison, published in 2012.

Bruker. "Quasi-Static Nanoindentation: An Overivew." The date of publication is unknown. Retrieved online on Jul. 11, 2019 from https://www.bruker.com/products/surface-and-dimensional-analysis/nanomechanical-test-instruments/landing-pages/nanoindentation.html.

Kuiry, Suresh. "Advanced Scratch Testing for Evaluation of Coatings." Bruker, published on May 8, 2012.

U.S. Appl. No. 16/579,738, filed Sep. 23, 2019.

Final Office Action dated Apr. 15, 2021 in connection with U.S. Appl. No. 16/579,738.

* cited by examiner

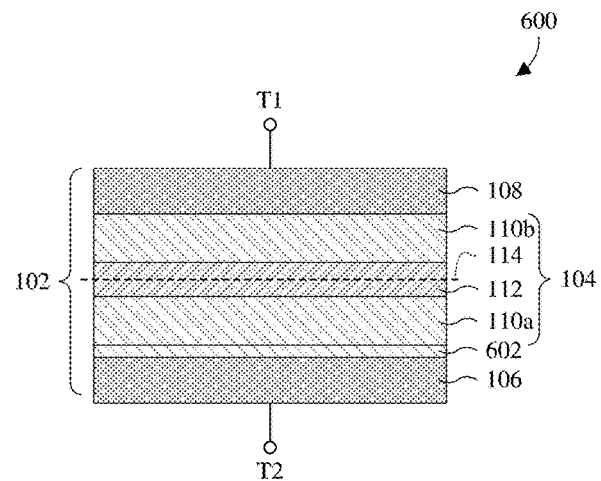
Fig. 6
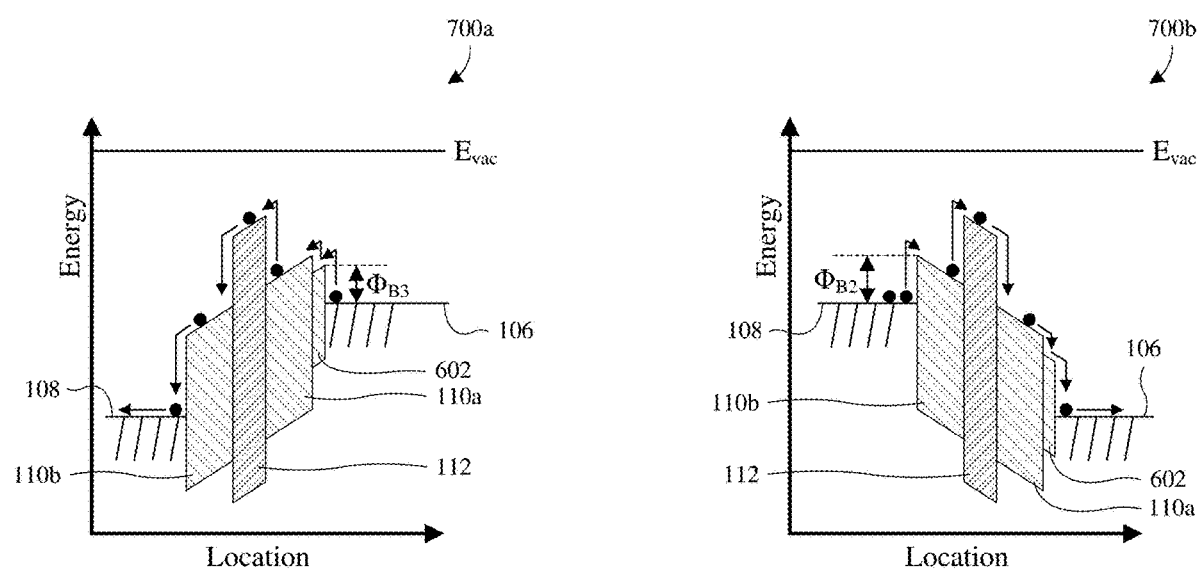
Fig. 7A  Fig. 7B

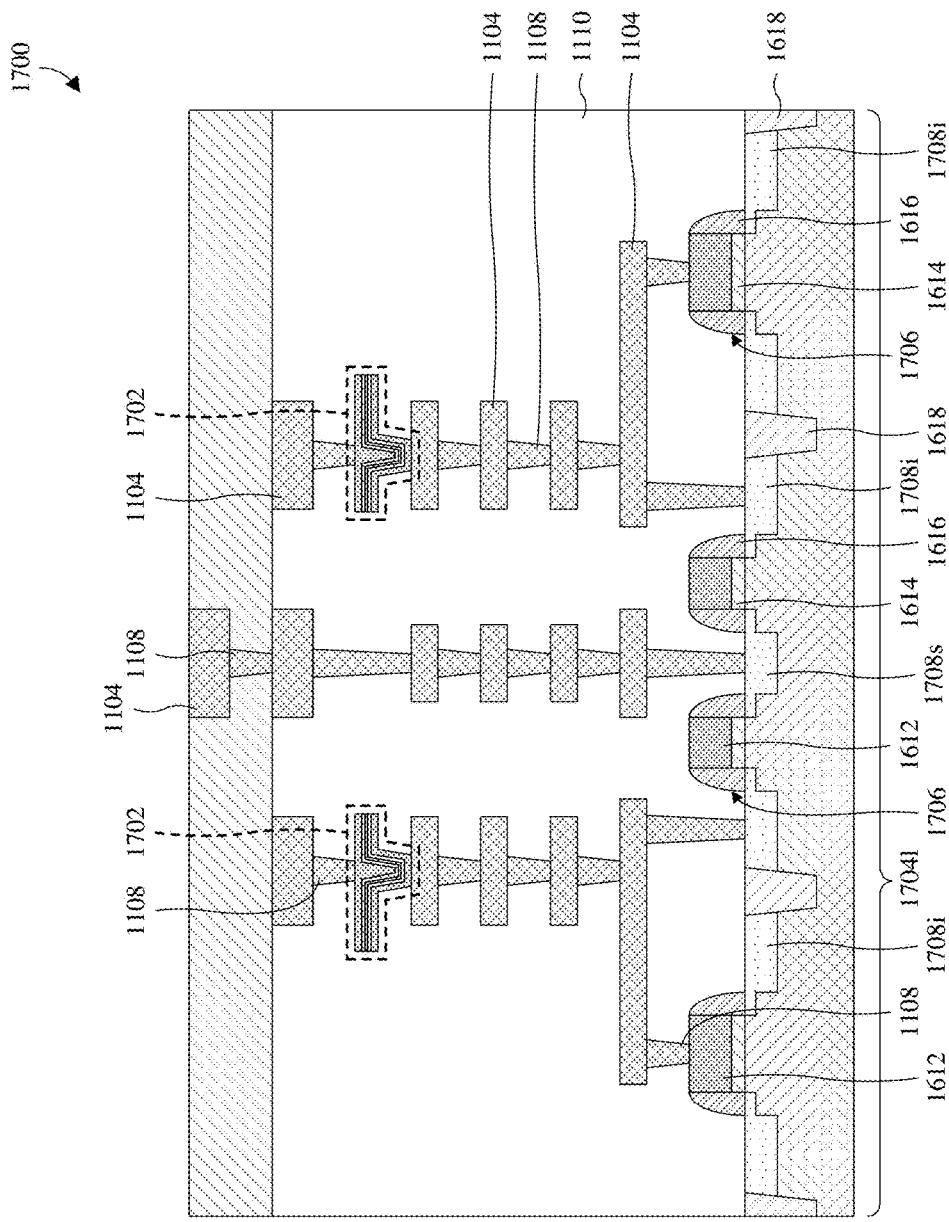
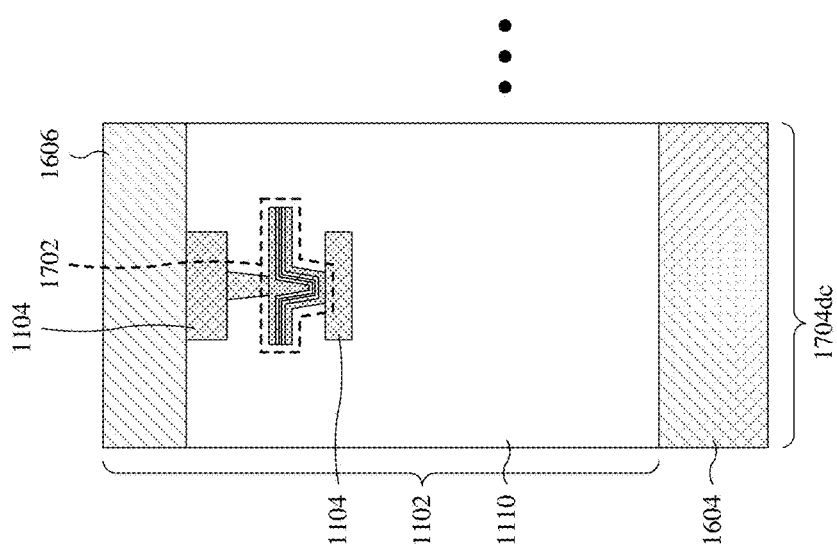
Fig. 17

US 11,430,729 B2

1

MIM CAPACITOR WITH A SYMMETRICAL CAPACITOR INSULATOR STRUCTURE

BACKGROUND

Integrated circuits (ICs) are formed on semiconductor dies comprising millions or billions of transistor devices. The transistor devices are configured to act as switches and/or to produce power gains so as to enable logical functionality. ICs also comprise passive devices used to control gains, time constants, and other IC characteristics. One type of passive device is a metal-insulator-metal (MIM) capacitor. MIM capacitors find application as, among other things, decoupling capacitors for high performance computing (HPC).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 illustrates a cross-sectional view of some embodiments of the MIM capacitor of FIG. 1.

FIGS. 7A-7B illustrates various energy band diagrams of the MIM capacitor of FIG. 6 according to some embodiments.

FIG. 17 illustrates a cross-sectional view of some more detailed embodiments of the IC of FIG. 11.

2

FIGS. 18-26 illustrates a series of cross-sectionals views of some embodiments of a method for forming an IC comprising a MIM capacitor having a capacitor insulator structure that is symmetrical.

Figure 27:
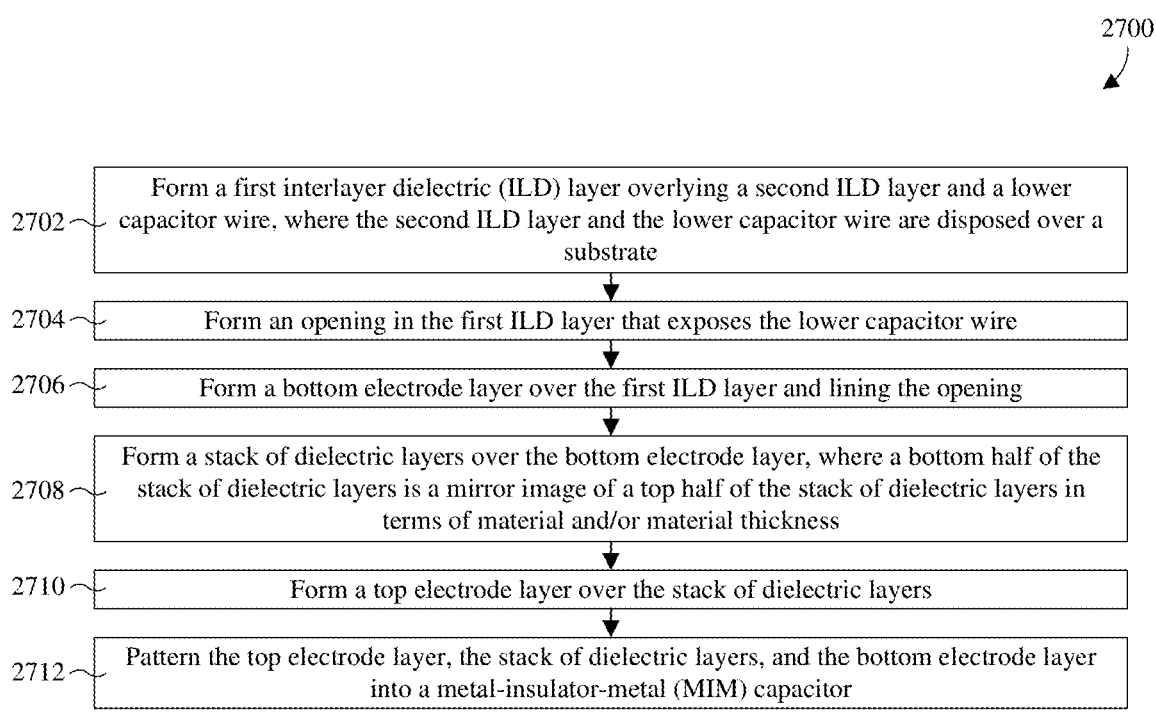

FIG. 27 illustrates a flowchart of some embodiments of a method for forming an IC comprising a MIM capacitor having a capacitor insulator structure that is symmetrical.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-insulator-metal (MIM) capacitor comprises a bottom electrode, a top electrode over the bottom electrode, and a capacitor insulator structure between the bottom and top electrodes. A method for forming the MIM capacitor may, for example, comprise: 1) depositing a bottom electrode layer; 2) depositing a multilayer high-k dielectric film one or more times over the bottom electrode layer; 3) depositing a top electrode layer over the one or more instances of the multilayer high-k dielectric film; and 4) patterning the top and bottom electrode layers and the instance(s) of the multilayer high-k dielectric film into the MIM capacitor. The top and bottom electrodes layers are patterned into the top and bottom electrodes, and the instances(s) of the multilayer high-k dielectric film is/are patterned into the capacitor insulator structure. The top and bottom electrodes share a common metal and hence have the same metal work functions. The multilayer high-k dielectric film comprises a bottom high-k dielectric structure and a top high-k dielectric structure overlying the bottom high-k dielectric structure.

The bottom high-k dielectric structure is configured to improve leakage performance (e.g., reduce leakage current) of the MIM capacitor. The bottom high-k dielectric structure may improve leakage current due to the bottom high-k dielectric structure being an amorphous solid (e.g., the amorphous solid may prevent leakage current from passing through grain boundaries of the top high-k dielectric structure). As such, the bottom high-k dielectric structure comprises a different high-k dielectric material than the top high-k dielectric structure (e.g., to ensure the bottom high-k dielectric structure is an amorphous solid). Because the bottom high-k dielectric structure and the top high-k dielectric structure comprise different high-k dielectric materials, the bottom high-k dielectric structure and the top high-k dielectric structure have different electron affinities. Typically, a difference between the electron affinities of the bottom high-k dielectric structure and the top high-k dielectric structure is large (e.g., greater than or equal to about 1.4 volts (V)).

A challenge with the MIM capacitor is that the capacitor insulator structure is asymmetric. The bottom high-k dielectric structure is at the bottom electrode, and the top high-k dielectric structure is at the top electrode, such that a bottom half of the capacitor insulator structure is not a mirror image of a top half of the capacitor insulator structure in terms of dielectric materials. Because the capacitor insulator structure is asymmetric, the breakdown voltage of the MIM capacitor is different when the MIM capacitor is forward and reversed biased. In other words, when the MIM capacitor is forward biased, the MIM capacitor has a forward biased breakdown voltage, and when the MIM capacitor is reverse biased, the MIM capacitor has a reverse biased breakdown voltage that is different than the forward biased breakdown voltage. Further, because the capacitor insulator structure is asymmetric, and because the difference between the electron affinities of the bottom high-k dielectric structure and the top high-k dielectric structure is large, a difference between the forward biased breakdown voltage of the MIM capacitor and the reverse biased breakdown voltage of the MIM capacitor is large.

For example, while forward biased, breakdown of the MIM capacitor may occur if the electric field is strong enough for electrons to overcome an energy barrier height from a fermi level of the bottom electrode to a conduction band edge of the bottom high-k dielectric structure. While reverse biased, breakdown of the MIM capacitor may occur if the electric field is strong enough for electrons to overcome an energy barrier height from a fermi level of the top electrode to a conductive band edge of the top high-k dielectric structure. Because the top and bottom electrodes have a same work function and the bottom and top high-k dielectric structures have different electron affinities, the energy barrier height from the fermi level of the bottom electrode to the conduction band edge of the bottom high-k dielectric structure is different than the energy barrier height from the fermi level of the top electrode to the conductive band edge of the top high-k dielectric structure. As such, the bottom high-k dielectric structure may at least partially define the breakdown voltage while the MIM capacitor is forward biased, whereas the top high-k dielectric structure may at least partially define the breakdown voltage while the MIM capacitor is reverse biased. Therefore, the forward biased breakdown voltage of the MIM capacitor is different than the reverse biased breakdown voltage of the MIM capacitor. Further, because the difference between the electron affinities of the bottom high-k dielectric structure and the top high-k dielectric structure is large, the difference between the forward biased breakdown voltage of the MIM capacitor and the reverse biased breakdown voltage of the MIM capacitor is large.

Because the forward biased breakdown voltage of the MIM capacitor is different than the reverse biased breakdown voltage of the MIM capacitor, utility of the MIM capacitor may be limited when used in certain applications. More specifically, because the difference between the forward biased breakdown voltage of the MIM capacitor and the reverse biased breakdown voltage of the MIM capacitor is large, the utility of the MIM capacitor may be limited when used for bipolar applications. For example, when used as a decoupling capacitor for high performance computing (HPC), the MIM capacitor may be limited by the smaller of the two breakdown voltages (e.g., if the forward biased breakdown voltage of the MIM capacitor is smaller than the reverse biased breakdown voltage of the MIM capacitor, the MIM capacitor may be limited by the smaller forward biased breakdown voltage of the MIM capacitor).

Various embodiments of the present application are directed towards a MIM capacitor comprising a capacitor insulator structure that is symmetrical. The capacitor insulator structure is disposed between a top electrode and a bottom electrode. The capacitor insulator structure comprises at least three dielectric structures vertically stacked upon each other. A bottom half of the capacitor insulator structure is a mirror image of a top half of the capacitor insulator structure in terms of dielectric materials of the dielectric structures. Because the bottom half of the capacitor insulator structure is a mirror image of the top half of the capacitor insulator structure in terms of the dielectric materials of the dielectric structures, the capacitor insulator structure is symmetrical. Because the capacitor insulator structure is symmetrical, a difference between the forward biased breakdown voltage of the MIM capacitor and the reverse biased breakdown voltage of the MIM capacitor is relatively small (e.g., smaller than the large difference between the forward biased breakdown voltage and the reverse biased breakdown voltage of the MIM capacitor having the asymmetrical capacitor insulator structure). Thus, the symmetrical capacitor insulator structure may improve (e.g., increase) the utility of the MIM capacitor. More specifically, the symmetrical capacitor insulator structure may improve (e.g., increase) the utility of the MIM capacitor when used for bipolar applications (e.g., as a decoupling capacitor for HPC).

Figure 1:
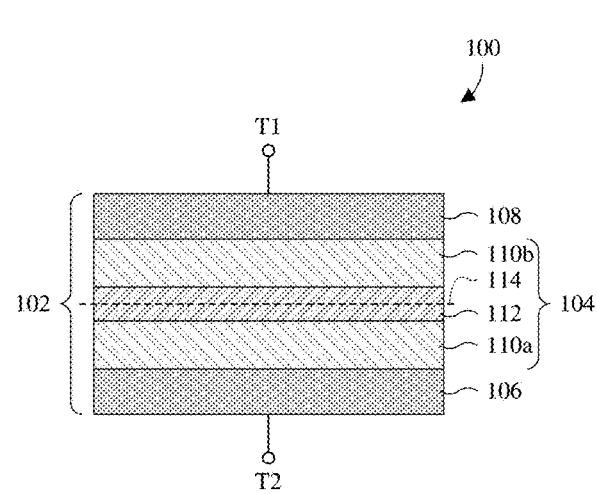
FIG. 1 illustrates a cross-sectional view of some embodiments of a metal-insulator-metal (MIM) capacitor having a capacitor insulator structure that is symmetrical.

FIG. 1 illustrates a cross-sectional view 100 of some embodiments of a metal-insulator-metal (MIM) capacitor 102 having a capacitor insulator structure that is symmetrical.

As shown in the cross-sectional view 100 of FIG. 1, the MIM capacitor 102 comprises a capacitor insulator structure 104 disposed between a bottom electrode 106 and a top electrode 108. The top electrode 108 overlies the bottom electrode 106. The capacitor insulator structure 104 overlies the bottom electrode 106, and the top electrode 108 overlies the capacitor insulator structure 104. The top electrode 108 defines or is otherwise electrically coupled to a first terminal T1 of the MIM capacitor 102, and the bottom electrode 106 defines or is otherwise electrically coupled to a second terminal T2 of the MIM capacitor 102.

The bottom electrode 106 and the top electrode 108 are conductive and may, for example, be or comprise titanium (Ti), titanium nitride (TiN), tantalum (Ta), tantalum nitride (TaN), some other conductive material, or a combination of the foregoing. In some embodiments, the bottom electrode 106 and the top electrode 108 are or comprise a same material. For example, in some embodiments, both the top electrode 108 and the bottom electrode 106 are or comprise titanium nitride (TiN).

The capacitor insulator structure 104 comprises a first plurality of dielectric structures 110. For example, the capacitor insulator structure 104 comprises a first dielectric structure 110a and a second dielectric structure 110b. The capacitor insulator structure 104 also comprises a third dielectric structure 112. The third dielectric structure 112 is between the first dielectric structure 110a and the second dielectric structure 110b. The third dielectric structure 112 is configured to improve leakage performance (e.g., reduce leakage current) of the MIM capacitor 102. The first dielectric structure 110a overlies the bottom electrode 106, the third dielectric structure 112 overlies the first dielectric structure 110a, and the second dielectric structure 110b overlies the third dielectric structure 112.

The first dielectric structure 110a is nearer the bottom electrode 106 than both the second dielectric structure 110b and the third dielectric structure 112. The second dielectric structure 110b is nearer the top electrode 108 than both the first dielectric structure 110a and the third dielectric structure 112. In some embodiments, the third dielectric structure 112 contacts (e.g., directly contacts) the first dielectric structure 110a and the second dielectric structure 110b. In further embodiments, the first dielectric structure 110a contacts (e.g., directly contacts) the bottom electrode 106. In yet further embodiments, the second dielectric structure 110b contacts (e.g., directly contacts) the top electrode 108.

The first plurality of dielectric structures 110 may, for example, be or comprise zirconium oxide ($ZrO_2$), aluminum oxide ($Al_2O_3$), hafnium oxide ($HfO_2$), tantalum oxide ($Ta_2O_5$), silicon dioxide ($SiO_2$), some other dielectric material, or any combination of the foregoing. In some embodiments, the first plurality of dielectric structures 110 are or comprise a metal oxide (e.g., $ZrO_2$, $Al_2O_3$, $HfO_2$, $Ta_2O_5$, or the like) and/or are or comprise a high-k dielectric. A high-k dielectric may, for example, be a dielectric material having a dielectric constant greater than about 3.9 or some other suitable value.

The third dielectric structure 112 may, for example, be or comprise zirconium oxide ($ZrO_2$), aluminum oxide ($Al_2O_3$), hafnium oxide ($HfO_2$), tantalum oxide ($Ta_2O_5$), silicon dioxide ($SiO_2$), some other dielectric material, or any combination of the foregoing. In some embodiments, the third dielectric structure 112 is or comprises a metal oxide (e.g., $ZrO_2$, $Al_2O_3$, $HfO_2$, $Ta_2O_5$, or the like) and/or is or comprises a high-k dielectric. In some embodiments, the third dielectric structure 112 is an amorphous solid (e.g., amorphous $ZrO_2$, $Al_2O_3$, $HfO_2$, $Ta_2O_5$, or the like).

The first plurality of dielectric structures 110 are or comprise a same dielectric material. For example, both the first dielectric structure 110a and the second dielectric structure 110b are or comprise a first dielectric material. The third dielectric structure 112 is or comprises a second dielectric material different than the first dielectric material. For example, in some embodiments, both the first dielectric structure 110a and the second dielectric structure 110b are or comprise zirconium oxide ($ZrO_2$), and the third dielectric structure 112 is or comprises aluminum oxide ($Al_2O_3$). In such embodiments, the capacitor insulator structure 104 may be said to have a ZAZ stack of dielectric structures, where "Z" corresponds to a first letter of the first dielectric material (e.g., $ZrO_2$) and "A" corresponds to a first letter of the second dielectric material (e.g., $Al_2O_3$). It will be appreciated that the capacitor insulator structure 104 may have other configurations of stacks of dielectric structures, such as, AZA, HZH, ZHZ, ZTZ, TZT, etc.

The capacitor insulator structure 104 is symmetrical. The capacitor insulator structure 104 is symmetrical because a bottom half of the capacitor insulator structure 104 is a mirror image of a top half of the capacitor insulator structure 104 in terms of the dielectric materials of the dielectric structures of the capacitor insulator structure 104. For example, an axis of symmetry 114 extends laterally through the third dielectric structure 112. Therefore, the bottom half of the capacitor insulator structure 104 comprises the first dielectric structure 110a and a first portion (e.g., a bottom half) of the third dielectric structure 112, and the top half of the capacitor insulator structure 104 comprises the second dielectric structure 110b and a second portion (e.g., a top half) of the third dielectric structure 112. The first and second dielectric structures 110a, 110b are or comprise the first dielectric material, and the third dielectric structure 112 is or comprises the second dielectric material. Thus, in terms of the dielectric materials of the dielectric structures of the capacitor insulator structure 104, the bottom half of the capacitor insulator structure 104 is a mirror image of the top half of the capacitor insulator structure 104 across the axis of symmetry 114.

Because the capacitor insulator structure 104 is symmetrical, a difference between a forward biased breakdown voltage of the MIM capacitor 102 and a reverse biased breakdown voltage of the MIM capacitor 102 is small (e.g., less than or equal to about 0.9 volts (V)). Thus, the capacitor insulator structure 104 may improve (e.g., increase) the utility of the MIM capacitor 102. More specifically, the capacitor insulator structure 104 may improve (e.g., increase) the utility of the MIM capacitor 102 when used for bipolar applications (e.g., as a decoupling capacitor for HPC). In some embodiments, the difference between the forward biased breakdown voltage of the MIM capacitor 102 and the reverse biased breakdown voltage of the MIM capacitor 102 is about a 35 percent improvement over (e.g., 35 percent less than) a difference between a forward biased breakdown voltage and a reverse biased breakdown voltage of a typical MIM capacitor used for bipolar applications (e.g., a MIM capacitor having an asymmetrical capacitor insulator structure).

Figure 2:
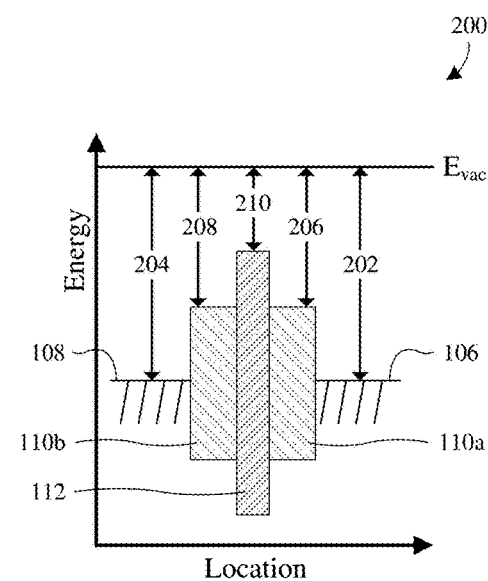
FIG. 2 illustrates an energy band diagram of the MIM capacitor of FIG. 1 according to some embodiments.

FIG. 2 illustrates an energy band diagram 200 of the MIM capacitor 102 of FIG. 1 according to some embodiments. The energy band diagram 200 of FIG. 2 illustrates when the MIM capacitor 102 is at equilibrium (e.g., neither forward biased nor reverse biased).

As shown in the energy band diagram 200 of FIG. 2, the energy band diagram 200 is constructed so that the band structures of the bottom electrode 106, the top electrode 108, the first dielectric structure 110a, the second dielectric structure 110b, and the third dielectric structure 112, are aligned (e.g., at a same energy level) along a vacuum level $E_{vac}$.

The bottom electrode 106 has a work function 202 that is at least partially dependent upon the material of the bottom electrode 106. The work function 202 of the bottom electrode 106 is the energy difference between the fermi level of the bottom electrode 106 and the vacuum level $E_{vac}$. The top electrode 108 has a work function 204 that is at least partially dependent upon the material of the top electrode 108. The work function 204 of the top electrode 108 is the energy difference between the fermi level of the top electrode 108 and the vacuum level $E_{vac}$. In some embodiments, the work function 202 of the bottom electrode 106 is substantially the same as the work function 204 of the top electrode 108. For example, in some embodiments, the top and bottom electrodes 108, 106 are or comprise a same material (e.g., TiN) and hence the work function 202 of the bottom electrode 106 is substantially the same as the work function 204 of the top electrode 108.

The first dielectric structure 110a has an electron affinity 206 that is at least partially dependent upon the material of the first dielectric structure 110a. The electron affinity 206 of the first dielectric structure 110a is the energy difference between the conduction band edge of the first dielectric structure 110a and the vacuum level $E_{vac}$. The second dielectric structure 110b has an electron affinity 208 that is at least partially dependent upon the material of the second dielectric structure 110b. The electron affinity 208 of the second dielectric structure 110b is the energy difference between the conduction band edge of the second dielectric structure 110b and the vacuum level $E_{vac}$. The electron affinity 206 of the first dielectric structure 110a is substantially the same as the electron affinity 208 of the second dielectric structure 110b. In some embodiments, the electron affinity 206 of the first dielectric structure 110a and the electron affinity 208 of the second dielectric structure 110b are substantially the same due to, at least in part, the first dielectric structure 110a and the second dielectric structure 110b being or comprising a same dielectric material (e.g., $ZrO_2$).

Figure 3A:
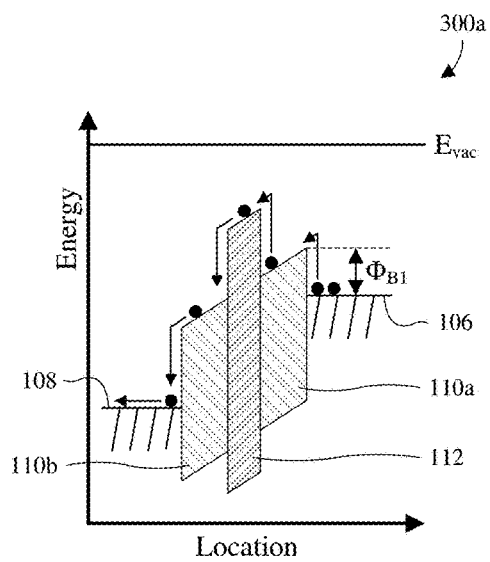
FIGS. 3A-3B illustrates various energy band diagrams of the MIM capacitor of FIG. 1 according to some embodiments.
Figure 3B:
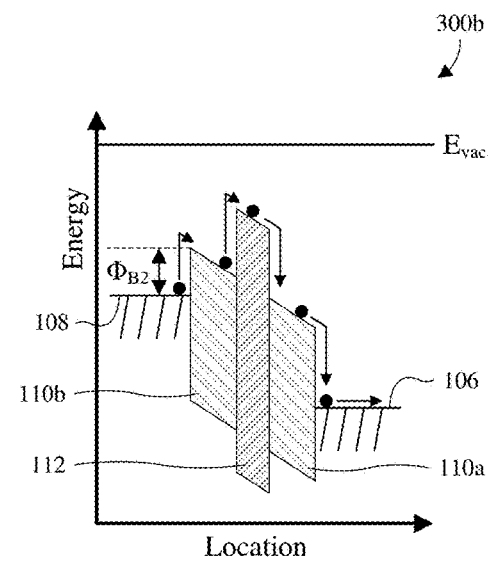

FIGS. 3A-3B illustrates various energy band diagrams of the MIM capacitor 102 of FIG. 1 according to some embodiments.

FIG. 3A illustrates an energy band diagram 300a of some embodiments of the MIM capacitor 102 when the MIM capacitor 102 is forward biased (e.g., the second terminal T2 is the injection site).

As shown in the energy band diagram 300a of FIG. 3A, when the MIM capacitor 102 is forward biased, a first band offset $\Phi_{B1}$ exists between the bottom electrode 106 and the first dielectric structure 110a. The first band offset $\Phi_{B1}$ is the energy difference between the fermi level of the bottom electrode 106 and the conduction band edge of the first dielectric structure 110a when the MIM capacitor 102 is forward biased. In other words, the first band offset $\Phi_{B1}$ is the energy difference between the work function 202 of the bottom electrode 106 and the electron affinity 206 of the first dielectric structure 110a when the MIM capacitor 102 is reverse biased.

When the MIM capacitor 102 is forward biased, the MIM capacitor 102 has a forward biased breakdown voltage (e.g., a minimum voltage that causes a portion of the capacitor insulator structure 104 to become electrically conductive). If a voltage is applied to the MIM capacitor 102 that forward biases the MIM capacitor 102 and exceeds (or approaches) the forward biased breakdown voltage, the MIM capacitor 102 may fail (e.g., due to the electrical breakdown of the capacitor insulator structure 104). The forward biased breakdown voltage is dependent at least partially upon the first band offset $\Phi_{B1}$. For example, if a voltage is applied to the MIM capacitor 102 that forward biases the MIM capacitor 102 and exceeds (or approaches) the forward biased breakdown voltage, one or more electrons (denoted by a black dot in FIGS. 3A and 3B) may have sufficient energy to overcome the first band offset $\Phi_{B1}$ (and/or approach the conduction band edge of the first dielectric structure 110a), thereby causing the electrical breakdown of the capacitor insulator structure 104 (e.g., due to one or more breakdown mechanisms, such as electron hopping, electron tunneling, etc.).

FIG. 3B illustrates an energy band diagram 300b of some embodiments of the MIM capacitor 102 when the MIM capacitor 102 is reverse biased (e.g., the first terminal T1 is the injection site).

As shown in the energy band diagram 300b of FIG. 3B, when the MIM capacitor 102 is reverse biased, a second band offset $\Phi_{B2}$ exists between the top electrode 108 and the second dielectric structure 110b. The second band offset $\Phi_{B2}$ is the energy difference between the fermi level of the top electrode 108 and the conduction band edge of the second dielectric structure 110b when the MIM capacitor 102 is reverse biased. In other words, the second band offset $\Phi_{B2}$ is the energy difference between the work function 204 of the top electrode 108 and the electron affinity 208 of the second dielectric structure 110b when the MIM capacitor 102 is reverse biased.

When the MIM capacitor 102 is reverse biased, the MIM capacitor 102 has a reverse biased breakdown voltage (e.g., a minimum voltage that causes a portion of the capacitor insulator structure 104 to become electrically conductive). If a voltage is applied to the MIM capacitor 102 that reverse biases the MIM capacitor 102 and exceeds (or approaches) the reverse biased breakdown voltage, the MIM capacitor 102 may fail (e.g., due to the electrical breakdown of the capacitor insulator structure 104). The reverse biased breakdown voltage is dependent at least partially upon the second band offset $\Phi_{B2}$. For example, if a voltage is applied to the MIM capacitor 102 that reverse biases the MIM capacitor 102 and exceeds (or approaches) the forward biased breakdown voltage, one or more electrons may have sufficient energy to overcome the second band offset $\Phi_{B2}$ (and/or approach the conduction band edge of the second dielectric structure 110b), thereby causing the electrical breakdown of the capacitor insulator structure 104 (e.g., due to one or more breakdown mechanisms, such as electron hopping, electron tunneling, etc.).

Because the capacitor insulator structure 104 is symmetrical, the first band offset $\Phi_{B1}$ is substantially the same as the second band offset $\Phi_{B2}$. Thus, the difference between the forward biased breakdown voltage of the MIM capacitor 102 and the reverse biased breakdown voltage of the MIM capacitor 102 is small. Accordingly, the capacitor insulator structure 104 may improve (e.g., increase) the utility of the MIM capacitor 102 when used for bipolar applications (e.g., as a decoupling capacitor for HPC). For example, when used for bipolar applications, because the smaller of the forward biased breakdown voltage of the MIM capacitor 102 and the reverse biased breakdown voltage of the MIM capacitor 102 may limit the utility of the MIM capacitor 102 for bipolar applications, the small difference between the forward biased breakdown voltage of the MIM capacitor 102 and the reverse biased breakdown voltage of the MIM capacitor 102 may improve (e.g., increase) the utility of the MIM capacitor 102 over a typical MIM capacitor (e.g., a MIM capacitor having an asymmetrical capacitor insulator structure). More specifically, the small difference between the forward biased breakdown voltage of the MIM capacitor 102 and the reverse biased breakdown voltage of the MIM capacitor 102 may increase the effective barrier height of the capacitor insulator structure 104 over the typical MIM capacitor (e.g., increasing from about 1.6 electronvolts (eV) to about 3.0 eV).

The third dielectric structure 112 has an electron affinity 210 that is at least partially dependent upon the material of the third dielectric structure 112. The electron affinity 210 of the third dielectric structure 112 is the energy difference between conduction band edge of the third dielectric structure 112 and the vacuum level $E_{vac}$. In some embodiments, the electron affinity 210 of the third dielectric structure 112 is different than the electron affinity 206 of the first dielectric structure 110a and the electron affinity 208 of the second dielectric structure 110b. In some embodiments, the electron affinity 210 of the third dielectric structure 112 is different than the electron affinity 206 of the first dielectric structure 110a and the electron affinity 208 of the second dielectric structure 110b due to, at least in part, the third dielectric structure 112 being or comprising a dielectric material (e.g., $Al_2O_3$) that is different than the dielectric material (e.g., $ZrO_2$) of the first and second dielectric structures 110a, 110b. In other embodiments, the electron affinity 210 of the third dielectric structure 112 is less than the electron affinity 206 of the first dielectric structure 110a and the electron affinity 208 of the second dielectric structure 110b. In some embodiments, because the electron affinity 210 of the third dielectric structure 112 is less than the electron affinity 206 of the first dielectric structure 110a and the electron affinity 208 of the second dielectric structure 110b, the third dielectric structure 112 may improve leakage performance (e.g., reduce leakage current) of the MIM capacitor 102 (e.g., by reducing the likelihood that one or more electrons tunnels through the capacitor insulator structure 104).

In some embodiments, the electron affinity 210 of the third dielectric structure 112 may also depend, at least partially, on the internal atomic structure of the third dielectric structure 112. For example, the third dielectric structure 112 may be an amorphous solid (e.g., amorphous $Al_2O_3$), and therefore the third dielectric structure 112 has the electron affinity 210. Thus, in some embodiments, the third dielectric structure 112 may improve leakage performance of the MIM capacitor 102 due to, at least partially, the third dielectric structure 112 being an amorphous solid.

Figure 4:
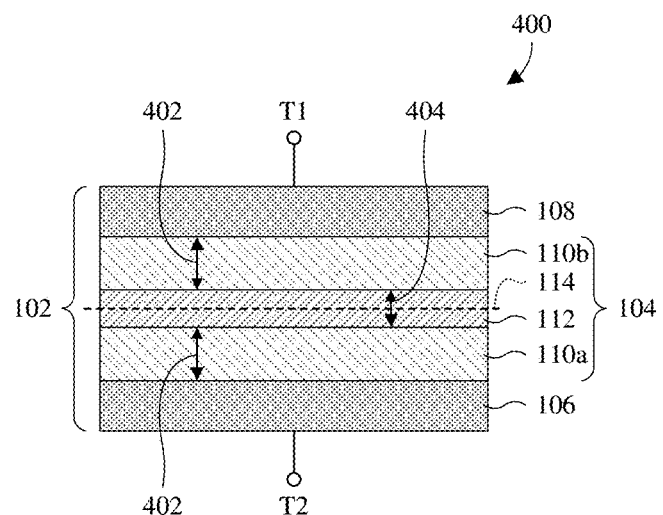
FIG. 4 illustrates a cross-sectional view of some embodiments of the MIM capacitor of FIG. 1.

FIG. 4 illustrates a cross-sectional view 400 of some embodiments of the MIM capacitor 102 of FIG. 1.

As shown in the cross-sectional view 400 of FIG. 4, the first dielectric structure 110a and the second dielectric structure 110b both have a first thickness 402. The first thickness 402 may be between about 10 angstroms (Å) and about 35 Å. If the first thickness 402 is less than about 10 Å, capacitance density of the MIM capacitor 102 may be too small to reliably function as a decoupling capacitor for HPC. If the first thickness 402 is greater than about 35 Å, leakage performance of the MIM capacitor 102 may be too poor (e.g., leakage is too high) to reliably function as a decoupling capacitor for HPC.

The third dielectric structure 112 has a second thickness 404 that is less than or equal to the first thickness 402. The second thickness 404 is greater than about 5 Å. If the second thickness 404 is less than about 5 Å, the leakage performance of the MIM capacitor 102 may be too poor to reliably function as a decoupling capacitor for HPC. If the second thickness 404 is greater than the first thickness 402, manufacturing costs may be increased without any appreciable performance benefit. In some embodiments, the first thickness 402 is about 20 Å and the second thickness is about 20 Å; the first thickness 402 is about 25 Å and the second thickness is about 5 Å; the first thickness 402 is about 31 Å and the second thickness is about 6 Å; or the first thickness 402 is about 25 Å and the second thickness is about 5 Å. In some embodiments, an overall thickness of the capacitor insulator structure 104 (e.g., a sum of all of the thicknesses of the dielectric structures of the capacitor insulator structure 104) is between about 60 Å and 90 Å.

In some embodiments, the capacitor insulator structure 104 is symmetrical because a bottom half of the capacitor insulator structure 104 is a mirror image of a top half of the capacitor insulator structure 104 in terms of the thicknesses of the dielectric structures of the capacitor insulator structure 104. For example, an axis of symmetry 114 extends laterally through the third dielectric structure 112. Therefore, the bottom half of the capacitor insulator structure 104 comprises the first dielectric structure 110a and a first portion (e.g., a bottom half) of the third dielectric structure 112, and the top half of the capacitor insulator structure 104 comprises the second dielectric structure 110b and a second portion (e.g., a top half) of the third dielectric structure 112. The first and second dielectric structures 110a, 110b have the first thickness 402, and the third dielectric structure 112 has the second thickness 404. Thus, in terms of the thicknesses of the dielectric structures of the capacitor insulator structure 104, the bottom half of the capacitor insulator structure 104 is a mirror image of the top half of the capacitor insulator structure 104 across the axis of symmetry 114.

In some embodiments, the electron affinity 206 of the first dielectric structure 110a, the electron affinity 208 of the second dielectric structure 110b, and the electron affinity 210 of the third dielectric structure 112 are at least partially dependent upon the thicknesses of the first dielectric structure 110a, the second dielectric structure 110b, and the third dielectric structure 112, respectively. Therefore, the first band offset $\Phi_{B1}$ and the second band offset $\Phi_{B2}$ at least partially depend on the thicknesses of the first dielectric structure 110a and the second dielectric structure 110b, respectively. Accordingly, because the capacitor insulator structure 104 is also symmetrical in terms of the thicknesses of the dielectric structures of the capacitor insulator structure 104, the utility of the MIM capacitor 102 may be further improved when used for bipolar applications (e.g., due to even a smaller difference between the first band offset $\Phi_{B1}$ and the second band offset $\Phi_{B2}$).

Figure 5:
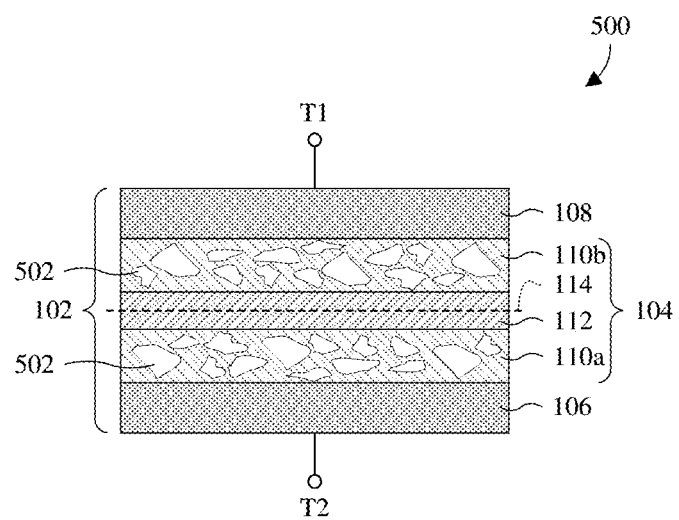
FIG. 5 illustrates a cross-sectional view of some embodiments of the MIM capacitor of FIG. 1.

FIG. 5 illustrates a cross-sectional view 500 of some embodiments of the MIM capacitor 102 of FIG. 1.

As shown in the cross-sectional view 500 of FIG. 5, the first plurality of dielectric structures 110 comprise one or more crystals 502 (e.g., the first plurality of dielectric structures 110 are monocrystalline solids and/or a polycrystalline solids). The one or more crystals 502 (e.g., crystallites) each have a crystalline lattice. The crystalline lattices of the one or more crystals 502 may be, for example, monoclinic, tetragonal, cubic, or the like. In some embodiments, because the first plurality of dielectric structures 110 comprise the one or more crystals 502, the MIM capacitor 102 may have better (e.g., higher) capacitance density. In some embodiments, the first plurality of dielectric structures 110 comprise the one or more crystals 502, while the third dielectric structure 112 is an amorphous solid. In further embodiments, because the first plurality of dielectric structures 110 comprise the one or more crystals 502, and because the third dielectric structure 112 is an amorphous solid, the MIM capacitor 102 may have a high capacitance density and good leakage performance (e.g., low leakage).

In some embodiments, the one or more crystals 502 of the first dielectric structure 110a have different crystalline lattices. For example, the one or more crystals 502 of the first dielectric structure 110a are less than or equal to about 20 percent by weight (wt %) monoclinic crystals, less than or equal to about 20 wt % cubic crystals, and between about 40 wt % and 80 wt % tetragonal crystals. In other embodiments, the crystalline lattices of the one or more crystals 502 of the first dielectric structure 110a may be the same (e.g., tetragonal). In some embodiments, because the one or more crystals 502 of the first dielectric structure 110a are less than or equal to about 20 wt % monoclinic crystals, less than or equal to about 20 wt % cubic crystals, and between about 40 wt % and 80 wt % tetragonal crystals, the MIM capacitor 102 may have better (e.g., even higher) capacitance density and better (e.g., even higher) leakage performance (e.g., even lower leakage).

In some embodiments, the one or more crystals 502 of the second dielectric structure 110b have different crystalline lattices. For example, the one or more crystals 502 of the second dielectric structure 110b are less than or equal to about 20 wt % monoclinic crystals, less than or equal to about 20 wt % cubic crystals, and between about 40 wt % and 80 wt % tetragonal crystals. In other embodiments, the crystalline lattices of the one or more crystals 502 of the second dielectric structure 110b may be the same (e.g., tetragonal). In some embodiments, because the one or more crystals 502 of the second dielectric structure 110b are less than or equal to about 20 wt % monoclinic crystals, less than or equal to about 20 wt % cubic crystals, and between about 40 wt % and 80 wt % tetragonal crystals, the MIM capacitor 102 may have better (e.g., even higher) capacitance density and better (e.g., even higher) leakage performance (e.g., even lower leakage).

In some embodiments, the crystalline lattices of the one or more crystals 502 of the second dielectric structure 110b may be substantially the same as the crystalline lattices of the one or more crystals 502 of the first dielectric structure 110a. For example, the one or more crystals 502 of the second dielectric structure 110b may comprise substantially the same percentages of monoclinic crystals, cubic crystals, and tetragonal crystals as the first dielectric structure 110a. In such embodiments, the MIM capacitor 102 may have good capacitance density when both forward and reverse biased (e.g., the same capacitance density values when forward biased and reverse biased at predefined corresponding voltages).

FIG. 6 illustrates a cross-sectional view 600 of some embodiments of the MIM capacitor 102 of FIG. 1.

As shown in the cross-sectional view 600 of FIG. 6, a first capacitor interfacial layer 602 is disposed between the capacitor insulator structure 104 and the bottom electrode 106. In some embodiments, the first capacitor interfacial layer 602 contacts (e.g., directly contacts) the bottom electrode 106. In further embodiments, the first capacitor interfacial layer 602 contacts (e.g., directly contacts) the capacitor insulator structure 104. In yet further embodiments, the first capacitor interfacial layer 602 contacts (e.g., directly contacts) the first dielectric structure 110a.

The first capacitor interfacial layer 602 comprises a metal element (e.g., titanium (Ti), tantalum (Ta), etc.) and a non-metal element (e.g., nitrogen (N), oxygen (O), etc.). The bottom electrode 106 comprises the metal element of the first capacitor interfacial layer 602. In some embodiments, the first capacitor interfacial layer 602 comprises the metal element, the non-metal element, and oxygen (O). For example, the bottom electrode 106 is or comprises titanium nitride (TiN), and the first capacitor interfacial layer 602 is or comprises titanium oxynitride (TiON). The first capacitor interfacial layer 602 has an electron affinity that is different than (e.g., less than) the electron affinity 206 of the first dielectric structure 110a.

FIGS. 7A-7B illustrates various energy band diagrams of the MIM capacitor 102 of FIG. 6 according to some embodiments.

FIG. 7A illustrates an energy band diagram 700a of some embodiments of the MIM capacitor 102 when the MIM capacitor 102 is forward biased.

As shown in the energy band diagram 700a of FIG. 7A, when the MIM capacitor 102 is reverse biased, a third band offset $\Phi_{B3}$ exists between the bottom electrode 106 and the first capacitor interfacial layer 602. The third band offset $\Phi_{B3}$ is the energy difference between the fermi level of the bottom electrode 106 and the conduction band edge of the first capacitor interfacial layer 602 when the MIM capacitor 102 is forward biased. In other words, the third band offset $\Phi_{B3}$ is the energy difference between the work function 202 of the bottom electrode 106 and the electron affinity of the first capacitor interfacial layer 602 when the MIM capacitor 102 is forward biased. The forward biased breakdown voltage of the MIM capacitor 102 may depend upon the third band offset $\Phi_{B3}$.

FIG. 7B illustrates an energy band diagram 700b of some embodiments of the MIM capacitor 102 when the MIM capacitor 102 is forward biased.

As shown in the energy band diagram 700b of FIG. 7B, when the MIM capacitor 102 is reverse biased, a second band offset $\Phi_{B2}$ exists between the top electrode 108 and the second dielectric structure 110b. In some embodiments, the third band offset $\Phi_{B3}$ may be less than the second band offset $\Phi_{B2}$. The reverse biased breakdown voltage is dependent at least partially upon the second band offset $\Phi_{B2}$.

While the third band offset $\Phi_{B3}$ may be less than the second band offset $\Phi_{B2}$, the difference between the third band offset $\Phi_{B3}$ and the second band offset $\Phi_{B2}$ is still relatively smaller than a corresponding MIM capacitor having an asymmetrical capacitor insulator structure (e.g., a MIM capacitor having an asymmetrical capacitor insulator structure with an interfacial layer disposed between the asymmetrical capacitor insulator structure and a bottom electrode). Accordingly, the capacitor insulator structure 104 may improve (e.g., increase) the utility of the MIM capacitor 102 when used for bipolar applications (e.g., as a decoupling capacitor for HPC) by having a smaller difference between the forward biased breakdown voltage and the reverse biased breakdown voltage of the MIM capacitor 102.

Figure 8:
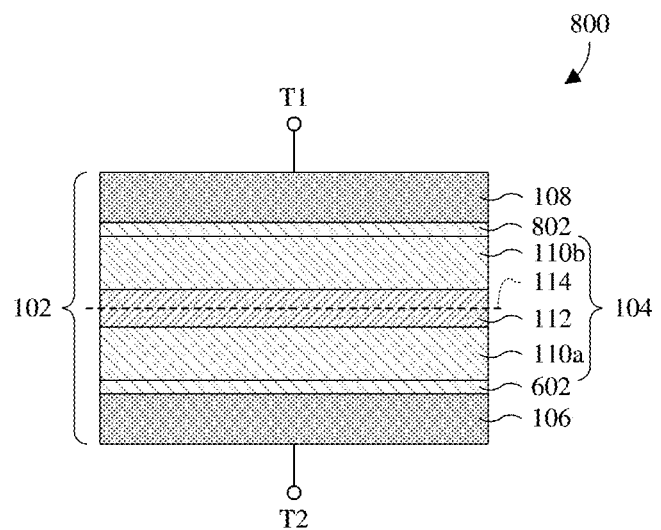
FIG. 8 illustrates a cross-sectional view of some embodiments of the MIM capacitor of FIG. 1.

FIG. 8 illustrates a cross-sectional view 800 of some embodiments of the MIM capacitor 102 of FIG. 1.

As shown in the cross-sectional view 800 of FIG. 8, a second capacitor interfacial layer 802 is disposed between the capacitor insulator structure 104 and the top electrode 108, and the first capacitor interfacial layer 602 is disposed between the capacitor insulator structure 104 and the bottom electrode 106. In some embodiments, the second capacitor interfacial layer 802 contacts (e.g., directly contacts) the top electrode 108. In further embodiments, the second capacitor interfacial layer 802 contacts (e.g., directly contacts) the capacitor insulator structure 104. In yet further embodiments, the second capacitor interfacial layer 802 contacts (e.g., directly contacts) the second dielectric structure 110b.

The second capacitor interfacial layer 802 comprises a metal element (e.g., titanium (Ti), tantalum (Ta), etc.) and a non-metal element (e.g., nitrogen (N), oxygen (O), etc.). The top electrode 108 comprises the metal element of the second capacitor interfacial layer 802. In some embodiments, the second capacitor interfacial layer 802 comprises the metal element, the non-metal element, and oxygen (O). For example, the top electrode 108 is or comprises titanium nitride (TiN), and the second capacitor interfacial layer 802 is or comprises titanium oxynitride (TiON). The second capacitor interfacial layer 802 has an electron affinity that is different than (e.g., less than) the electron affinity 208 of the second dielectric structure 110b.

In some embodiments, the second capacitor interfacial layer 802 and the first capacitor interfacial layer 602 are a same material (e.g., TiON). In further embodiments, the electron affinity of the second capacitor interfacial layer 802 may be substantially the same as the electron affinity of the first capacitor interfacial layer 602. Accordingly, the capacitor insulator structure 104 may improve (e.g., increase) the utility of the MIM capacitor 102 when used for bipolar applications by having a smaller difference between the forward biased breakdown voltage and the reverse biased breakdown voltage of the MIM capacitor 102. In further embodiments, a thickness of the second capacitor interfacial layer 802 is substantially the same as a thickness of the first capacitor interfacial layer 602. In such embodiments, the electron affinity of the second capacitor interfacial layer 802 may be even closer to the electron affinity of the first capacitor interfacial layer 602. Accordingly, the capacitor insulator structure 104 may improve the utility of the MIM capacitor 102 when used for bipolar applications by having an even smaller difference between the forward biased breakdown voltage and the reverse biased breakdown voltage of the MIM capacitor 102.

Figure 9:
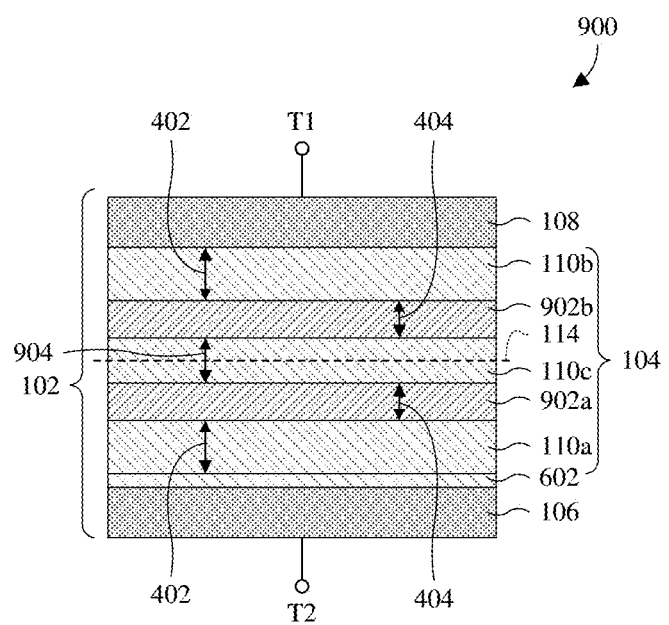
FIG. 9 illustrates a cross-sectional view of some embodiments of the MIM capacitor of FIG. 1.

FIG. 9 illustrates a cross-sectional view 900 of some embodiments of the MIM capacitor 102 of FIG. 1.

As shown in the cross-sectional view 900 of FIG. 9, the capacitor insulator structure 104 comprises the first plurality of dielectric structures 110 and a second plurality of dielectric structures 902. The first plurality of dielectric structures 110 and the second plurality of dielectric structures 902 are vertically stacked upon each other. Each of the first plurality of dielectric structures 110 are separated from one another by one of the second plurality of dielectric structures 902, and vice versa.

In some embodiments, the first plurality of dielectric structures 110 comprise the first dielectric structure 110a, the second dielectric structure 110b, and a fourth dielectric structure 110c. In some embodiments, the fourth dielectric structure 110c is a middle dielectric structure of the first plurality of dielectric structures 110. For example, the fourth dielectric structure 110c is disposed vertically between the first dielectric structure 110a and the second dielectric structure 110b. In some embodiments, the second plurality of dielectric structures 902 comprise a fifth dielectric structure 902a and a sixth dielectric structure 902b. In further embodiments, the second plurality of dielectric structures 902 are amorphous solids.

The first plurality of dielectric structures 110 comprises N dielectric structures, where N is greater than or equal to two (2). The second plurality of dielectric structures 902 comprises M dielectric structures, where M is equal to N minus one (1). For example, as shown in the cross-sectional view 900 of FIG. 9, N is three (3) and M is two (2). It will be appreciated that N can be any integer greater than or equal to two.

The first plurality of dielectric structures 110 may, for example, be or comprise zirconium oxide ($ZrO_2$), aluminum oxide ($Al_2O_3$), hafnium oxide ($HfO_2$), tantalum oxide ($Ta_2O_5$), silicon dioxide ($SiO_2$), some other dielectric material, or any combination of the foregoing. In some embodiments, the first plurality of dielectric structures 110 are or comprise a metal oxide (e.g., $ZrO_2$, $Al_2O_3$, $HfO_2$, $Ta_2O_5$, or the like) and/or are or comprise a high-k dielectric. The second plurality of dielectric structures 902 may, for example, be or comprise zirconium oxide ($ZrO_2$), aluminum oxide ($Al_2O_3$), hafnium oxide ($HfO_2$), tantalum oxide ($Ta_2O_5$), silicon dioxide ($SiO_2$), some other dielectric material, or any combination of the foregoing. In some embodiments, the second plurality of dielectric structures 902 are or comprise a metal oxide (e.g., $ZrO_2$, $Al_2O_3$, $HfO_2$, $Ta_2O_5$, or the like) and/or are or comprise a high-k dielectric.

The first plurality of dielectric structures 110 are or comprise a same dielectric material. For example, the first dielectric structure 110a, the second dielectric structure 110b, and the fourth dielectric structure 110c are or comprise a first dielectric material. The second plurality of dielectric structures 902 are or comprise a same dielectric material. For example, the fifth dielectric structure 902a and the sixth dielectric structure 902b are or comprise a second dielectric material different than the first dielectric material. More specifically, in some embodiments, the first dielectric structure 110a, the second dielectric structure 110b, and the fourth dielectric structure 110c are or comprise zirconium oxide ($ZrO_2$), and the fifth dielectric structure 902a and the sixth dielectric structure 902b are or comprises aluminum oxide ($Al_2O_3$).

The capacitor insulator structure 104 alternates periodically between the first dielectric material and the second dielectric material from the bottom electrode 106 to the top electrode 108. For example, as shown in the cross-sectional view 900 of FIG. 9, the capacitor insulator structure 104 alternates back and forth between the first dielectric material (e.g., $ZrO_2$) and the second dielectric material (e.g., $Al_2O_3$). In such embodiments, the capacitor insulator structure 104 may be said to have a ZAZAZ stack of dielectric structures, where "Z" corresponds to a first letter of the first dielectric material (e.g., $ZrO_2$) and "A" corresponds to a first letter of the second dielectric material (e.g., $Al_2O_3$). It will be appreciated that the capacitor insulator structure 104 may have other configurations of stacks of dielectric structures, such as, AZAZA, HZHZH, ZHZHZ, TATAT, ATATA, ZTZTZ, TZTZT, etc.

The capacitor insulator structure 104 is symmetrical. The capacitor insulator structure 104 is symmetrical because a bottom half of the capacitor insulator structure 104 is a mirror image of a top half of the capacitor insulator structure 104 in terms of the dielectric materials of the dielectric structures of the capacitor insulator structure 104. For example, an axis of symmetry 114 extends laterally through the fourth dielectric structure 110c, and the bottom half of the capacitor insulator structure 104 is a mirror image of the top half of the capacitor insulator structure 104 in terms of the dielectric materials of the dielectric structures of the capacitor insulator structure 104. In some embodiments, the bottom half of the capacitor insulator structure 104 is a mirror image of the top half of the capacitor insulator structure 104 in terms of the dielectric materials of the dielectric structures of the capacitor insulator structure 104 because the capacitor insulator structure 104 alternates periodically between the first dielectric material and the second dielectric material from the bottom electrode 106 to the top electrode 108.

Because the capacitor insulator structure 104 is symmetrical, a difference between a forward biased breakdown voltage of the MIM capacitor 102 and a reverse biased breakdown voltage of the MIM capacitor 102 is small. Thus, the capacitor insulator structure 104 may improve (e.g., increase) the utility of the MIM capacitor 102. More specifically, the capacitor insulator structure 104 may improve (e.g., increase) the utility of the MIM capacitor 102 when used for bipolar applications (e.g., as a decoupling capacitor for HPC).

In some embodiments, the second plurality of dielectric structures 902 each have the second thickness 404. In further embodiments, the first dielectric structure 110a and the second dielectric structure 110b both have the first thickness 402, and the fourth dielectric structure 110c has a third thickness 904. The third thickness 904 may be between about 10 Å and about 35 Å. If the third thickness 904 is less than about 10 Å, the capacitance density of the MIM capacitor 102 may be too small to reliably function as a decoupling capacitor for HPC. If the third thickness 904 is greater than about 35 Å, leakage performance of the MIM capacitor 102 may be too poor (e.g., leakage is too high) to reliably function as a decoupling capacitor for HPC.

In some embodiments, the third thickness 904 and the first thickness 402 are substantially the same. In other embodiments, the third thickness 904 is different than the first thickness 402. For example, in some embodiments, the third thickness 904 is less than the first thickness 402. In further embodiments, the third thickness 904 is between about 10 Å and about 20 Å, and the first thickness is between about 21 Å and about 35 Å. In some embodiments, because the thickness of the third thickness 904 (e.g., between about 10 Å and about 20 Å) is less than the first thickness 402 (e.g., between about 21 Å and about 35 Å), the MIM capacitor 102 may have improved leakage performance.

In some embodiments, the first plurality of dielectric structures 110 comprise the one or more crystals 502 (see, e.g., FIG. 5). In some embodiments, the first plurality of dielectric structures 110 comprise the one or more crystals 502, while the second plurality of dielectric structures 902 are amorphous solids. In some embodiments, the crystalline lattices of the one or more crystals 502 of the first plurality of dielectric structures 110 are the same. For example, the one or more crystals 502 of the first dielectric structure 110a may comprise substantially the same percentages of monoclinic crystals, cubic crystals, and tetragonal crystals as both the second dielectric structure 110b and the fourth dielectric structure 110c.

In other embodiments, the crystalline lattices of the one or more crystals 502 of the first dielectric structure 110a and the second dielectric structure 110b are substantially the same, while the crystalline lattices of the one or more crystals 502 of the fourth dielectric structure 110c are different. For example, the first dielectric structure 110a and the second dielectric structure 110b have substantially similar percentages of monoclinic crystals, cubic crystals, and/or tetragonal crystals, while the fourth dielectric structure 110c has different percentages of monoclinic crystals, cubic crystals, and/or tetragonal crystals. More specifically, in some embodiments, the fourth dielectric structure 110c has a lower percentage of tetragonal crystals than both the first dielectric structure 110a and/or the second dielectric structure 110b. For example, the one or more crystals 502 of the fourth dielectric structure 110c are less than or equal to about 20 wt % monoclinic crystals, less than or equal to about 20 wt % cubic crystals, and between about 40 wt % and 80 wt % tetragonal crystals, and the one or more crystals 502 of both the first dielectric structure 110a and the second dielectric structure 110b are greater than about 80 wt % tetragonal crystals. In such embodiments, the MIM capacitor 102 may have a high capacitance density and good leakage performance. In further embodiments, because the thickness of the third thickness 904 (e.g., between about 10 Å and about 20 Å) is different than the first thickness 402 (e.g., between about 21 Å and about 35 Å), and because the crystalline lattices of the one or more crystals 502 of the fourth dielectric structure 110c are different than those of the first and second dielectric structures 110a, 110b, the MIM capacitor 102 may have even better leakage performance.

Figure 10:
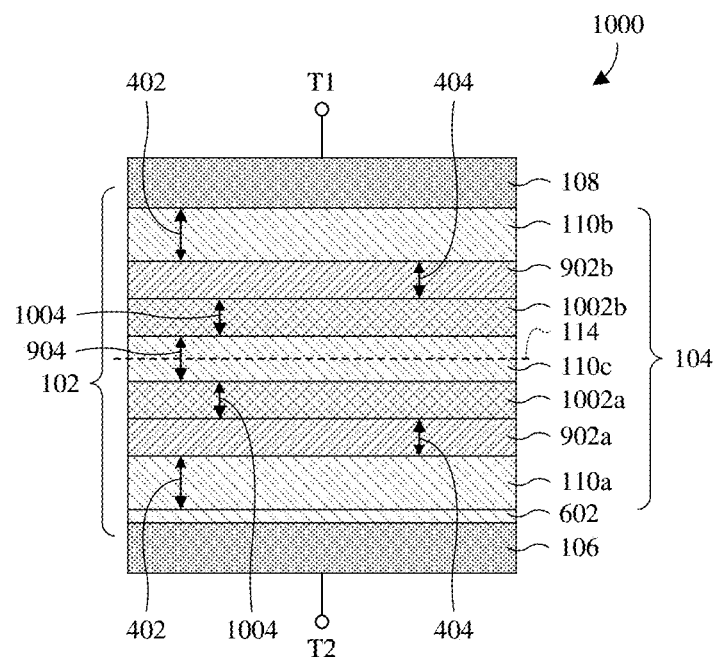
FIG. 10 illustrates a cross-sectional view of some embodiments of the MIM capacitor of FIG. 1.

FIG. 10 illustrates a cross-sectional view 1000 of some embodiments of the MIM capacitor 102 of FIG. 1.

As shown in the cross-sectional view 1000 of FIG. 10, the capacitor insulator structure 104 comprises the first plurality of dielectric structures 110, the second plurality of dielectric structures 902, and a third plurality of dielectric structures 1002. The first plurality of dielectric structures 110, the second plurality of dielectric structures 902, and the third plurality of dielectric structures 1002 are vertically stacked upon each other. Each of the first plurality of dielectric structures 110 are separated from one another by at least one of the third plurality of dielectric structures 1002 and one of the second plurality of dielectric structures 902. Each of the second plurality of dielectric structures 902 are separated from one another by at least one of the first plurality of dielectric structures 110 and one of the third plurality of dielectric structures 1002. Each of the third plurality of dielectric structures 1002 are separated from one another by at least one of the first plurality of dielectric structures 110. In some embodiments, one or more of the third plurality of dielectric structures 1002 are separated from another one of the third plurality of dielectric structures 1002 by at least one of the first plurality of dielectric structures 110 and one of the second plurality of dielectric structures 902. In further embodiments, the third plurality of dielectric structures 1002 comprise a seventh dielectric structure 1002a and an eighth dielectric structure 1002b.

The first plurality of dielectric structures 110 comprises N dielectric structures, where N is greater than or equal to two (2). The second plurality of dielectric structures 902 comprises M dielectric structures, where M is equal to N minus one (1). The third plurality of dielectric structures 1002 comprise X dielectric structures, where X is equal to M. For example, as shown in the cross-sectional view 900 of FIG. 9, N is three (3), M is two (2), and X is two (2). It will be appreciated that N can be any integer greater than or equal to two.

The third plurality of dielectric structures 1002 may, for example, be or comprise zirconium oxide ($ZrO_2$), aluminum oxide ($Al_2O_3$), hafnium oxide ($HfO_2$), tantalum oxide ($Ta_2O_5$), silicon dioxide ($SiO_2$), some other dielectric material, or any combination of the foregoing. In some embodiments, the third plurality of dielectric structures 1002 are or comprise a metal oxide (e.g., $ZrO_2$, $Al_2O_3$, $HfO_2$, $Ta_2O_5$, or the like) and/or are or comprise a high-k dielectric. In further embodiments, the third plurality of dielectric structures 1002 are amorphous solids or have one or more crystals (e.g., crystalline or polycrystalline solids).

The third plurality of dielectric structures 1002 are or comprise a same dielectric material. For example, the seventh dielectric structure 1002a and the eighth dielectric structure 1002b comprise a third dielectric material that is different than the first dielectric material (e.g., the dielectric material of the first plurality of dielectric structures 110) and the second dielectric material (e.g., the dielectric material of the second plurality of dielectric structures 902). More specifically, in some embodiments, the first plurality of dielectric structures 110 are or comprise zirconium oxide ($ZrO_2$), the second plurality of dielectric structures 902 are or comprise aluminum oxide ($Al_2O_3$), and the third plurality of dielectric structures 1002 are or comprise hafnium oxide ($HfO_2$). The capacitor insulator structure 104 alternates periodically among the first dielectric material, the second dielectric material, and the third dielectric material from the bottom electrode 106 to the top electrode 108. For example, as shown in the cross-sectional view 1000 of FIG. 10, the capacitor insulator structure 104 alternates in the following pattern: first dielectric material, second dielectric material, third dielectric material, first dielectric material, third dielectric material, second dielectric material, first dielectric material. In such embodiments, the capacitor insulator structure 104 may be said to have a ZAHZHAZ stack of dielectric structures, where "Z" corresponds to a first letter of the first dielectric material (e.g., $ZrO_2$), "A" corresponds to a first letter of the second dielectric material (e.g., $Al_2O_3$), and "H" corresponds to a first letter of the third dielectric material (e.g., $HfO_2$). It will be appreciated that the capacitor insulator structure 104 may have other configurations of stacks of dielectric structures, such as, AZHAHZA, ZHAZAHZ, HZAHAZH, ZHTZTHZ, HZTHZTH, TZHTHZT, ZAHZAHZHAZ, AZHAZHAHZA, etc.

The capacitor insulator structure 104 is symmetrical. The capacitor insulator structure 104 is symmetrical because a bottom half of the capacitor insulator structure 104 is a mirror image of a top half of the capacitor insulator structure 104 in terms of the dielectric materials of the dielectric structures of the capacitor insulator structure 104. For example, an axis of symmetry 114 extends laterally through the fourth dielectric structure 110c, and the bottom half of the capacitor insulator structure 104 is a mirror image of the top half of the capacitor insulator structure 104 in terms of the dielectric materials of the dielectric structures of the capacitor insulator structure 104. In some embodiments, the bottom half of the capacitor insulator structure 104 is a mirror image of the top half of the capacitor insulator structure 104 in terms of the dielectric materials of the dielectric structures of the capacitor insulator structure 104 because the capacitor insulator structure 104 alternates periodically among the first dielectric material, the second dielectric material, and the third dielectric material from the bottom electrode 106 to the top electrode 108.

Because the capacitor insulator structure 104 is symmetrical, a difference between a forward biased breakdown voltage of the MIM capacitor 102 and a reverse biased breakdown voltage of the MIM capacitor 102 is small. Thus, the capacitor insulator structure 104 may improve (e.g., increase) the utility of the MIM capacitor 102. More specifically, the capacitor insulator structure 104 may improve (e.g., increase) the utility of the MIM capacitor 102 when used for bipolar applications (e.g., as a decoupling capacitor for HPC).

In some embodiments, the third plurality of dielectric structures 1002 each have a fourth thickness 1004. The fourth thickness 1004 may be less than or equal to the first thickness 402. The second thickness 404 is greater than about 5 Å. If the second thickness 404 is less than about 5 Å, the leakage performance of the MIM capacitor 102 may be too poor to reliably function as a decoupling capacitor for HPC. In some embodiments, the fourth thickness 1004 is substantially the same as the second thickness 404. In other embodiments, the fourth thickness 1004 is different than the second thickness 404. In some embodiments, an overall thickness of the capacitor insulator structure 104 (e.g., a sum of all of the thicknesses of the dielectric structures of the capacitor insulator structure 104) is between about 60 Å and 90 Å.

Figure 11:
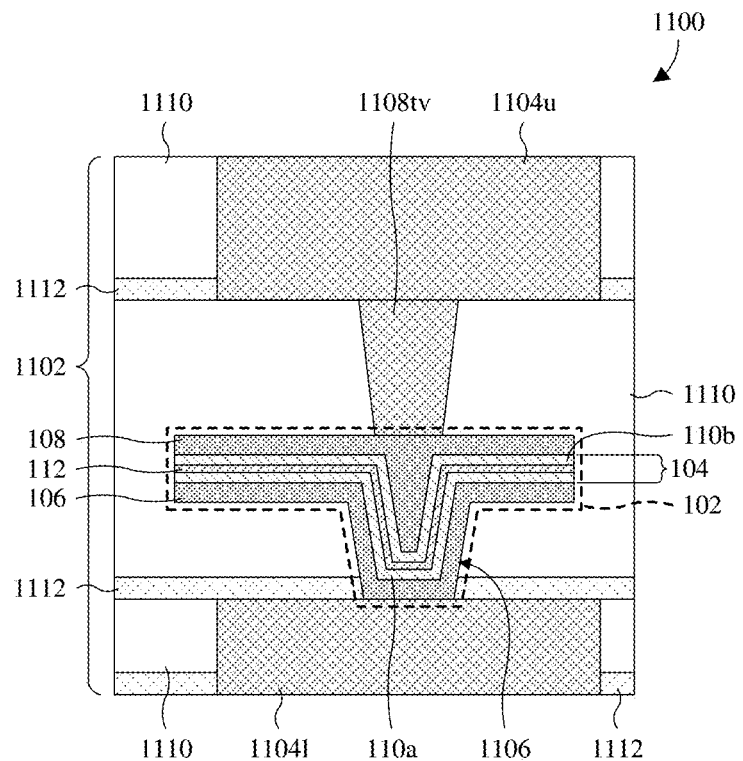
FIG. 11 illustrates a cross-sectional view of some embodiments of an integrated chip (IC) comprising an interconnect structure in which some embodiments of the MIM capacitor of FIG. 1 is embedded.

FIG. 11 illustrates a cross-sectional view 1100 of some embodiments of an integrated chip (IC) comprising an interconnect structure 1102 in which some embodiments of the MIM capacitor of FIG. 1 is embedded.

As shown in the cross-sectional view 1100 of FIG. 11, the MIM capacitor 102 overlies a lower capacitor wire 1104l and has a downward protrusion defining a bottom electrode via (BEVA) 1106. An upper capacitor wire 1104u overlies the MIM capacitor 102, and a top electrode via (TEVA) 1108tv extends from the upper capacitor wire 1104u to the MIM capacitor 102. The lower capacitor wire 1104l, the upper capacitor wire 1104u, and the TEVA 1108tv are conductive and may be or comprise, for example, copper (Cu), aluminum (Al), aluminum copper (AlCu), gold (Au), silver (Ag), tungsten (W), some other conductive material, or a combination of the foregoing.

The MIM capacitor 102, the lower capacitor wire 1104l, the upper capacitor wire 1104u, and the TEVA 1108tv are surrounded by a plurality of interlayer dielectric (ILD) layers 1110. The ILD layers 1110 are stacked upon each other and, in some embodiments, a plurality of etch stop layers 1112 separate the ILD layers 1110 from each other. In other embodiments, the etch stop layers 1112 are omitted. The ILD layers 1110 are a different material than the etch stop layers 1112. The ILD layers 1110 may be or comprise, for example, an oxide (e.g., silicon dioxide ($SiO_2$)), an oxy-nitride (e.g., silicon oxy-nitride (SiON)), doped silicon dioxide (e.g., carbon doped silicon dioxide), borosilicate glass (BSG), phosphoric silicate glass (PSG), borophosphosilicate glass (BPSG), fluorinated silicate glass (FSG), a low-k dielectric material, or the like. The etch stop layers 1112 may be or comprise, for example, a nitride (e.g., SiN), an oxy-nitride (e.g., silicon oxynitride (SiON)), a carbide (e.g., silicon carbide (SiC)), or the like. It will be appreciated that, in some embodiments, the first capacitor interfacial layer 602 may line the bottom electrode 106 between the first dielectric structure 110a and the bottom electrode 106 and/or the second capacitor interfacial layer 802 may line the second dielectric structure 110b between the second dielectric structure 110b and the top electrode 108.

Figure 12:
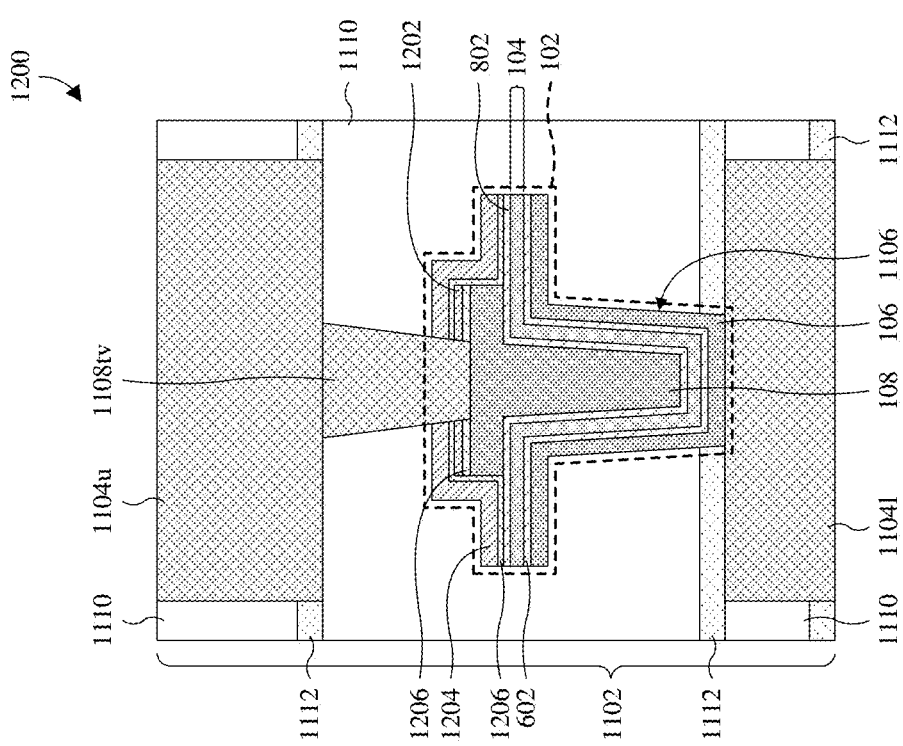
FIG. 12 illustrates a cross-sectional view of some other embodiments of the IC of FIG. 11.

FIG. 12 illustrates a cross-sectional view 1200 of some other embodiments of the IC of FIG. 11.

As shown in the cross-sectional view 1200 of FIG. 12, a top electrode hard mask 1202 and a bottom electrode hard mask 1204 cover the MIM capacitor 102. The top electrode hard mask 1202 covers and has the same or substantially the same top layout as the top electrode 108. The bottom electrode hard mask 1204 is disposed over and covers the top electrode hard mask 1202. The bottom electrode hard mask 1204 covers and has the same or substantially the same top layouts as the bottom electrode 106, the capacitor insulator structure 104, and the first capacitor interfacial layer 602. In some embodiments, the bottom electrode hard mask 1204 also covers and has the same or substantially the same top layout as the second capacitor interfacial layer 802. In other embodiments, the capacitor insulator structure 104 instead has the same or substantially the same top layout as the top electrode hard mask 1202. The top and bottom electrode hard masks 1202, 1204 may be or comprise, for example, a nitride (e.g., SiN), an oxy-nitride (e.g., SiON), a carbide (e.g., SiC), or the like.

In some embodiments, hard mask liners 1206 are individual to the top and bottom electrode hard masks 1202, 1204 and separate the top and bottom electrode hard masks 1202, 1204 from the capacitor insulator structure 104 and the top electrode 108. The hard mask liners 1206 are different materials than the top and bottom electrode hard masks 1202, 1204 and may be or comprise, for example, an oxide (e.g., $SiO_2$) and/or some other suitable dielectric(s). In other embodiments, the hard mask liners 1206 are omitted. It will be appreciated that, in some embodiments, the first capacitor interfacial layer 602 and/or the second capacitor interfacial layer 802 may be omitted.

Figure 13:
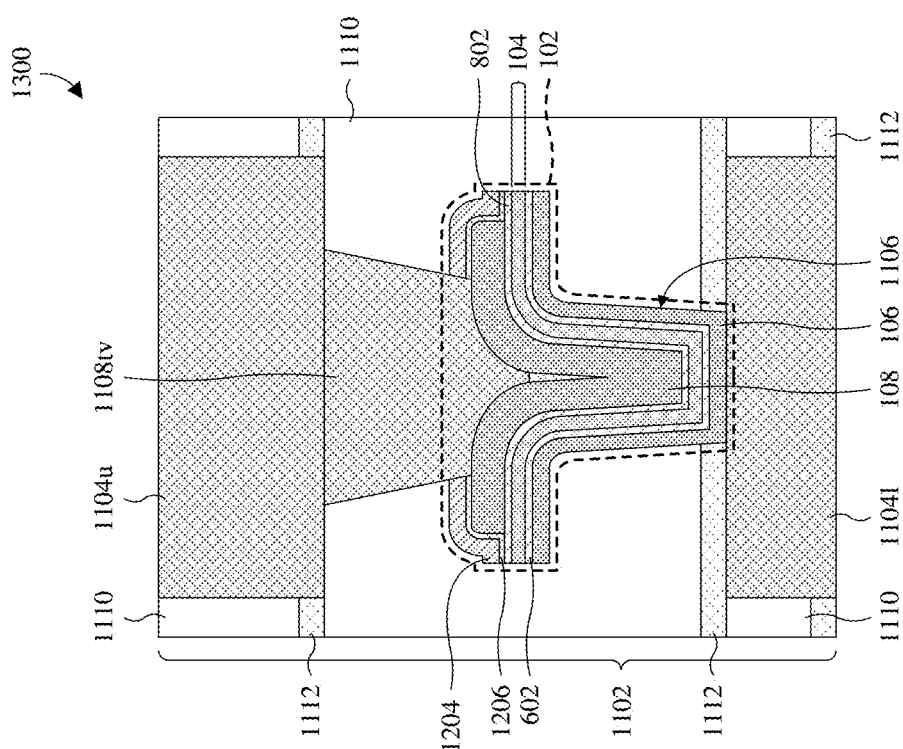
FIG. 13 illustrates a cross-sectional view of some other embodiments of the IC of FIG. 11.

FIG. 13 illustrates a cross-sectional view 1300 of some other embodiments of the IC of FIG. 11.

As shown in the cross-sectional view 1300 of FIG. 13, the top electrode 108 is indented at the BEVA 1106. Further, the bottom electrode 106, the first capacitor interfacial layer 602, the capacitor insulator structure 104, the second capacitor interfacial layer 802, and the top electrode 108 have curved edges. Moreover, the bottom electrode hard mask 1204 and its corresponding hard mask liner of the hard mask liners 1206 also have curved surfaces. In some embodiments, the top electrode hard mask 1202 and its corresponding hard mask liner of the hard mask liners 1206 are omitted. In other embodiments, the top electrode hard mask 1202 and its corresponding hard mask liner of the hard mask liners 1206 remain on the top electrode 108 and separate the top electrode 108 from the bottom electrode hard mask 1204 and its corresponding hard mask liner of the hard mask liners 1206. It will be appreciated that, in some embodiments, the first capacitor interfacial layer 602 and/or the second capacitor interfacial layer 802 may be omitted.

Figure 14:
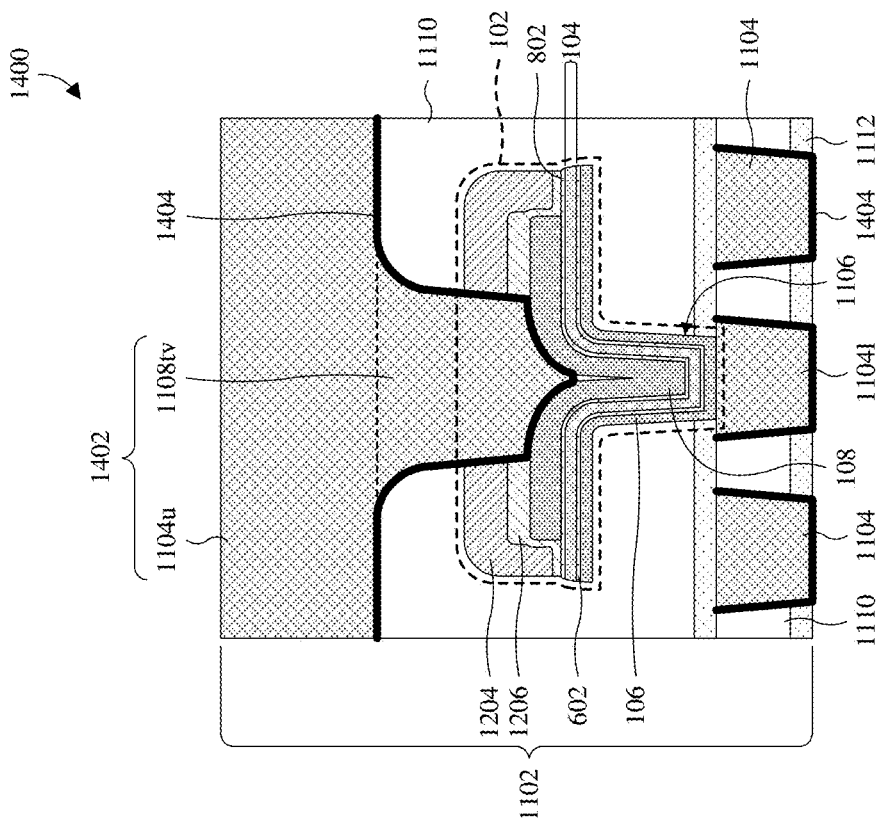
FIG. 14 illustrates a cross-sectional view of some other embodiments of the IC of FIG. 11.

FIG. 14 illustrates a cross-sectional view 1400 of some other embodiments of the IC of FIG. 11.

As shown in the cross-sectional view 1400 of FIG. 14, the MIM capacitor 102 overlies a plurality of additional wires 1104. Further, the TEVA 1108tv and the upper capacitor wire 1104u are integrated into a conductive structure 1402. Moreover, the conductive structure 1402, the lower capacitor wire 1104l, and the plurality of additional wires 1104 are lined by interconnect barrier layers 1404. The interconnect barrier layers 1404 are configured to prevent diffusion of material from the conductive structure 1402, the lower capacitor wire 1104l, and the plurality of additional wires 1104 to underlying structure(s). In some embodiments, the conductive structure 1402, the lower capacitor wire 1104l, and the plurality of additional wires 1104 are or comprise, for example, copper (Cu), aluminum (Al), aluminum copper (AlCu), gold (Au), silver (Ag), tungsten (W), some other conductive material, or a combination of the foregoing. In some embodiments, the interconnect barrier layers 1404 are or comprise, for example, titanium (Ti), tantalum (Ta), titanium nitride (TiN), tantalum nitride (TaN), some other suitable barrier material, or a combination of the foregoing. It will be appreciated that, in some embodiments, the first capacitor interfacial layer 602 and/or the second capacitor interfacial layer 802 may be omitted.

Figure 15:
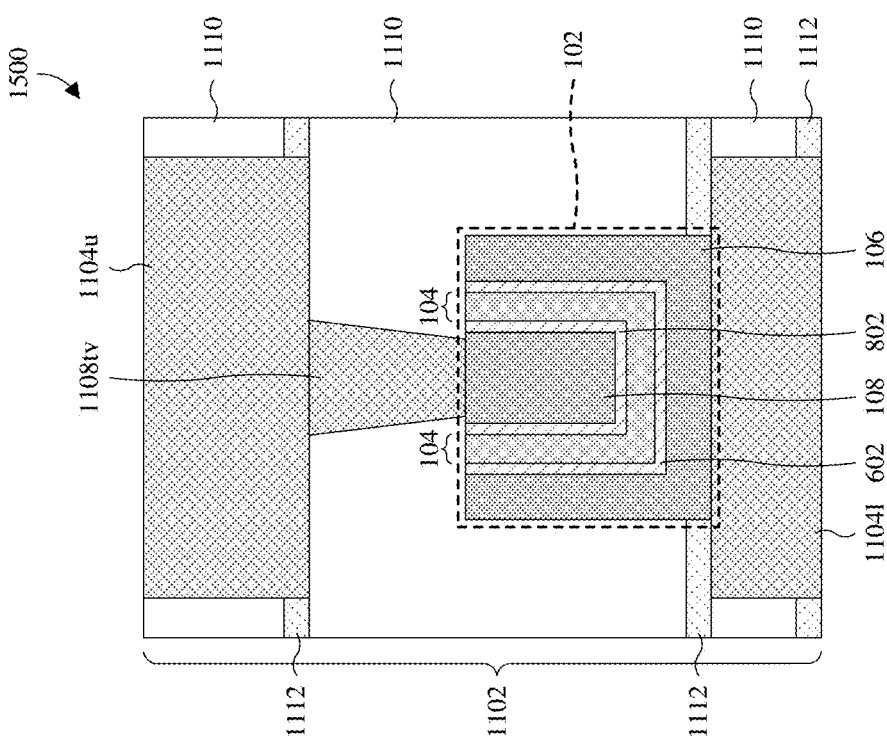
FIG. 15 illustrates a cross-sectional view of some other embodiments of the IC of FIG. 11.

FIG. 15 illustrates a cross-sectional view 1500 of some other embodiments of the IC of FIG. 11.

As shown in the cross-sectional view 1500 of FIG. 15, the BEVA 1106 is omitted. Further, the second capacitor interfacial layer 802 cups an underside of the top electrode 108, the capacitor insulator structure 104 cups an underside of the second capacitor interfacial layer 802, the first capacitor interfacial layer 602 cups an underside of the capacitor insulator structure 104, and the bottom electrode 106 cups an underside of the first capacitor interfacial layer 602. In some embodiments, the bottom electrode 106, the first capacitor interfacial layer 602, the capacitor insulator structure 104, and the second capacitor interfacial layer 802 have U or V shaped profiles. However, it will be appreciated that the bottom electrode 106, the first capacitor interfacial layer 602, the capacitor insulator structure 104, and the second capacitor interfacial layer 802 are not limited to these profile, and other profiles are amendable. It will also be appreciated that, in some embodiments, the first capacitor interfacial layer 602 and/or the second capacitor interfacial layer 802 may be omitted.

Figure 16:
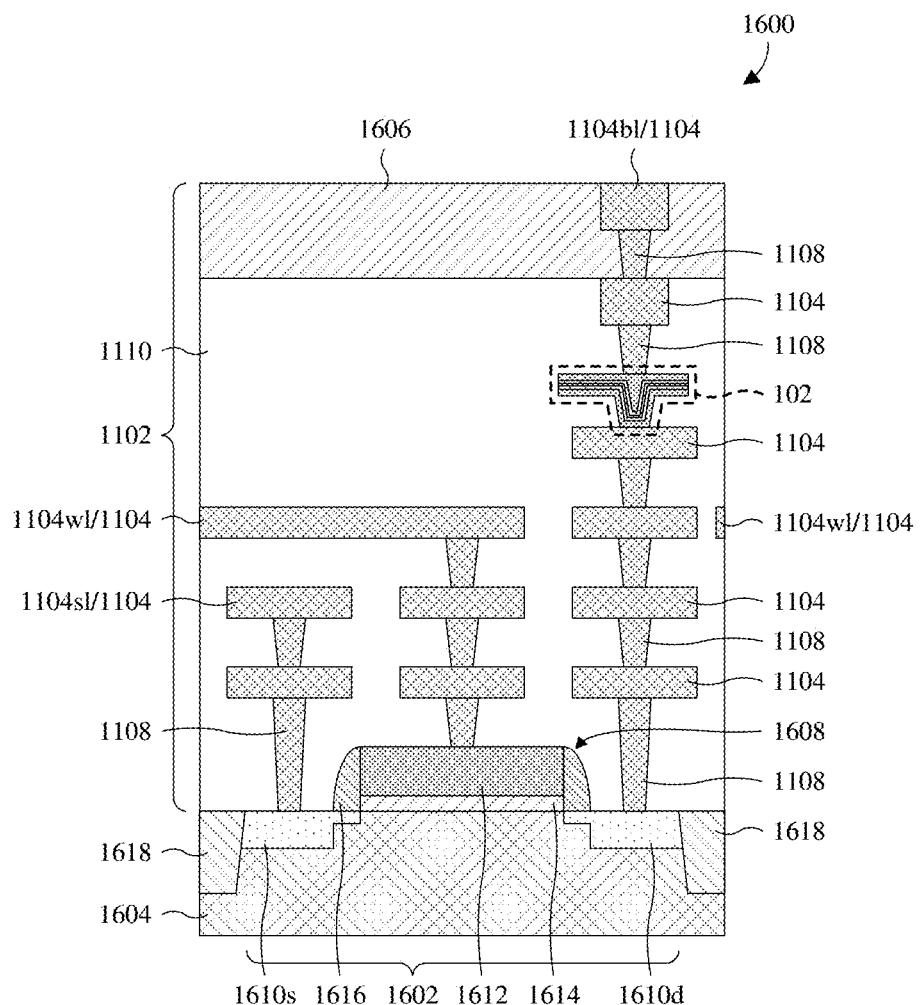
FIG. 16 illustrates a cross-sectional view of some more detailed embodiments of the IC of FIG. 11.

FIG. 16 illustrates a cross-sectional view 1600 of some more detailed embodiments of the IC of FIG. 11.

As shown in the cross-sectional view 1600 of FIG. 16, the IC comprises a one-transistor one-capacitor (1T1C) cell 1602. The 1T1C cell 1602 comprises a MIM capacitor 102. The cross-sectional view 1600 of FIG. 16 illustrates the MIM capacitor of FIG. 11. However, it will be appreciated that the MIM capacitor 102 may be configured as the MIM capacitor 102 in any one of FIGS. 1, 4-6, and 8-15 or some other suitable MIM capacitor. The MIM capacitor 102 overlies a substrate 1604 and is in an interconnect structure 1102. The substrate 1604 comprises any type of semiconductor body (e.g., monocrystalline silicon/CMOS bulk, germanium (Ge), silicon-germanium (SiGe), gallium arsenide (GaAs), silicon on insulator (SOI), etc.).

The interconnect structure 1102 comprises one or more ILD layers 1110. The one or more ILD layers 1110 may, for example, be as described with regard to FIG. 11. In some embodiments, the interconnect structure 1102 may comprise one or more etch stop layers 1112 (mot shown) (see, e.g., FIG. 11). The one or more etch stop layers 1112 may, for example, be as described with regard to FIG. 11. In some embodiments, the interconnect structure 1102 comprises a passivation layer 1606 overlying the one or more ILD layers 1110. The passivation layer 1606 is a different material than the one or more ILD layers 1110 and may be or comprise, for example, a nitride (e.g., SiN), an oxy-nitride (e.g., SiON), or the like.

The interconnect structure 1102 also comprises a plurality of wires 1104 and a plurality of vias 1108 stacked in the one or more ILD layers 1110 and the passivation layer 1606. The plurality of wires 1104 and the plurality of vias 1108 are conductive and define conductive paths leading from the MIM capacitor 102 and an underlying access transistor 1608. A first conductive path leads from the MIM capacitor 102 to a bit line 1104bl above the MIM capacitor 102. A second conductive path leads from the MIM capacitor 102 to a drain region 1610d of the access transistor 1608. A third conductive path leads from a source region 1610s of the access transistor 1608 to a source line 1104sl above the source region 1610s. A fourth conductive path leads from a gate electrode 1612 of the access transistor 1608 to a word line 1104wl above the gate electrode 1610. Note that while the word line 1104w1 is shown with two separate segments on opposite sides of the drain region 1610d, the word line 1104wl may be continuous outside the cross-sectional view 1600 of FIG. 16.

The access transistor 1608 comprises the drain and source regions 1610d, 1610s, and further comprises the gate electrode 1612 and a gate dielectric layer 1614. The drain and source regions 1610d, 1610s are in the substrate 1604 and correspond to doped regions of the substrate 1604. The gate electrode 1612 overlies the gate dielectric layer 1614 and is sandwiched between the drain and source regions 1610d, 1610s. In some embodiments, a sidewall spacer structure 1616 is on sidewalls of the gate electrode 1612, and/or the access transistor 1608 is surrounded by a trench isolation structure 1618 (e.g., a shallow trench isolation structure). The sidewall spacer structure 1616 and the trench isolation structure 1618 are or comprise dielectric material(s). The access transistor 1608 may be, for example, an insulated gate field-effect transistor (IGFET) or some other suitable transistor.

FIG. 17 illustrates a cross-sectional view 1700 of some more detailed embodiments of the IC of FIG. 11.

As shown in the cross-sectional view 1700 of FIG. 17, an interconnect structure 1102 overlies a substrate 1604. The interconnect structure 1102 and/or the substrate 1604 may, for example, be as described with regard to FIG. 16. The interconnect structure 1102 comprises one or more ILD layers 1110 and a passivation layer 1606 overlying the one or more ILD layers 1110.

A plurality of MIM capacitors 1702 are disposed in the interconnect structure 1102 and over the substrate 1604. The plurality of MIM capacitors 1702 are each configured as the MIM capacitor 102 in any one of FIGS. 1, 4-6, and 8-15 or some other suitable MIM capacitor. For example, as shown in the cross-sectional view 1700 of FIG. 17, the plurality of MIM capacitors 1702 are each configured as the MIM capacitor 102 of FIG. 11. However, it will be appreciated that each of the plurality of MIM capacitors 1702 may be configured as the MIM capacitor 102 in any one of FIGS. 1, 4-6, and 8-15 or some other suitable MIM capacitor. One or more MIM capacitors of the plurality of MIM capacitors 1702 are in a logic region 17041 of the IC, and one or more MIM capacitors of the plurality of MIM capacitors 1702 are in a decoupling-capacitor region 1704dc of the IC. It will be appreciated that, in some embodiments, the plurality of MIM capacitors 1702 may only comprise the one or more MIM capacitors that are in the decoupling-capacitor region 1704dc of the IC.

The interconnect structure 1102 comprises a plurality of wires 1104 and a plurality of vias 1108 stacked in the one or more ILD layers 1110 and the passivation layer 1606. The plurality of wires 1104 and the plurality of vias 1108 are conductive and define conductive paths leading from the MIM capacitors 1702 and also from multiple transistors 1706 under the MIM capacitors 1702. In some embodiments, there are no wires and vias, except for the illustrated wire 1104, directly under the one of the MIM capacitors 1702 in the decoupling-capacitor region 1704dc of the IC.

The transistors 1706 may, for example, each be configured as the access transistor 1608 of FIG. 16 and/or may, for example, each be an IGFET or some other suitable transistor. The transistors 1706 comprise individual source/drain regions 1708i, individual gate electrodes 1612, and individual gate dielectric layers 1614. Further, two of the transistors 1706 that neighbor one another share a shared source/drain region 1708s. The individual gate electrodes 1612 overlie the individual gate dielectric layers 1614, respectively, and are each sandwiched between two of the individual and/or shared source/drain regions 1708i, 1708s. In some embodiments, sidewall spacer structures 1616 are individual to the individual gate electrodes 1612 and line sidewalls of the individual gate electrodes 1612. In some embodiments, the transistors 1706 are surrounded and separated by a trench isolation structure 1618 (e.g., a shallow trench isolation structure). In some embodiments, there are no transistors and/or other semiconductor devices on the substrate 1604 directly under the one or more MIM capacitors that are in the decoupling-capacitor region 1704dc of the IC.

FIGS. 18-26 illustrates a series of cross-sectionals views 1800-2600 of some embodiments of a method for forming an IC comprising a MIM capacitor 102 having a capacitor insulator structure that is symmetrical. Although FIGS. 18-26 are described with reference to a method, it will be appreciated that the structures shown in FIGS. 18-26 are not limited to the method but rather may stand alone separate of the method.

Figure 18:
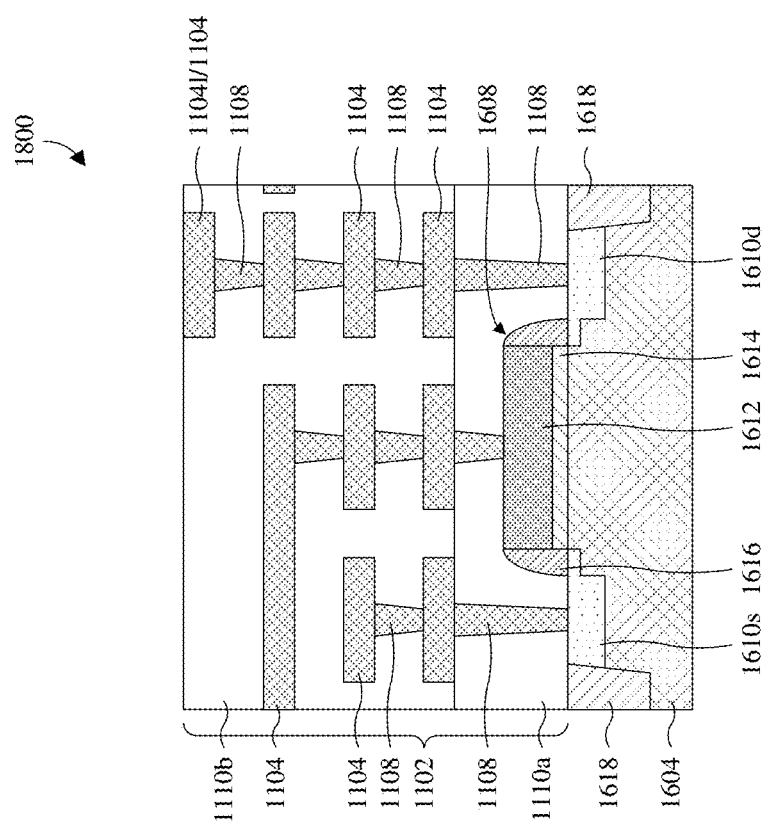

As shown in cross-sectional view 1800 of FIG. 18, a trench isolation structure 1618 and an access transistor 1608 are formed on a substrate 1604. The trench isolation structure 1618 is formed extending into a top of the substrate 1604 and has a pair of segments that are laterally spaced. The trench isolation structure 1618 may be, for example, a shallow trench isolation (STI) structure or some other suitable trench isolation structure. The access transistor 1608 is formed between the segments of the trench isolation structure 1618 after the trench isolation structure 1618 is formed. The access transistor 1608 comprises a gate dielectric layer 1614, a gate electrode 1612 overlying the gate dielectric layer 1614, and a sidewall spacer structure 1616 along sidewalls of the gate electrode 1612. Further, the access transistor 1608 comprises a source region 1610s and a drain region 1610d between which the gate electrode 1612 is sandwiched. The access transistor 1608 may be, for example, an IGFET or some other suitable transistor.

Also illustrated in the cross-sectional view 1800 of FIG. 18, an interconnect structure 1102 is partially formed over and electrically coupled to the access transistor 1608. The interconnect structure 1102 comprises a first ILD layer 1110a and a second ILD layer 1110b overlying the first ILD layer 1110a. Further, the interconnect structure 1102 comprises a plurality of wires 1104 and a plurality of vias 1108 stacked in the first and second ILD layers 1110a, 1110b. The plurality of wires 1104 and the plurality of vias 1108 define a conductive path leading from the access transistor 1608 to a lower capacitor wire 1104l of the plurality of wires 1104. The lower capacitor wire 1104l is at a top of the second ILD layer 1110b and provides a base in which to form a MIM capacitor on the lower capacitor wire 1104l, details of which are described in more detail hereafter.

Figure 19:
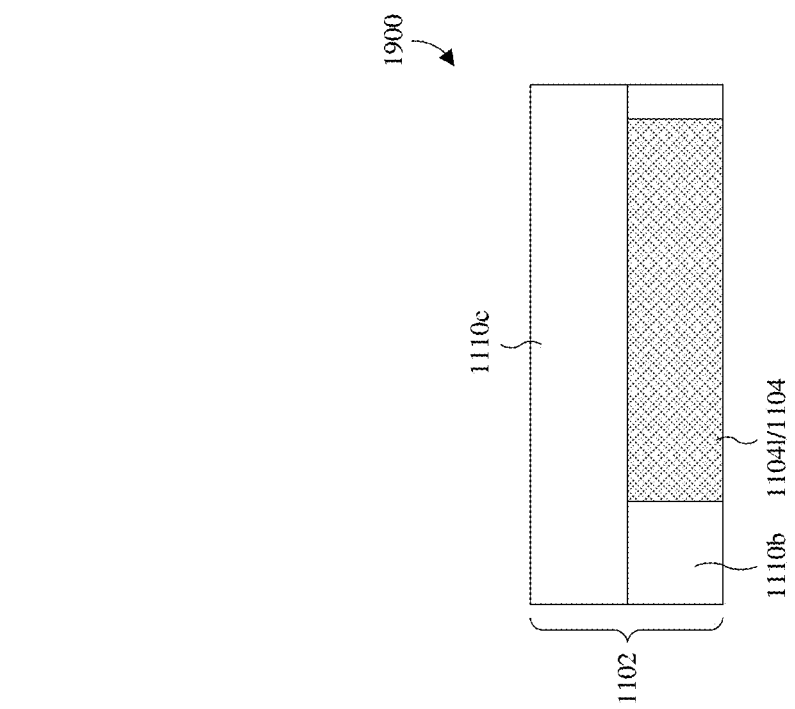

As shown in cross-sectional view 1900 of FIG. 19, a third ILD layer 1110c is deposited on the second ILD layer 1110b and the lower capacitor wire 1104l. For drawing compactness, a portion of the interconnect structure 1102 underlying the lower capacitor wire 2041 and the substrate 1604 are not shown herein (e.g., in FIG. 19) and hereafter (e.g., in FIGS. 20-26). The third ILD layer 1110c may be deposited by, for example, chemical vapor deposition (CVD), physical vapor deposition (PVD), atomic layer deposition (ALD), some other deposition process, or a combination of the foregoing. In some embodiments, an etch stop layer (e.g., 1112 in FIG. 11) is first deposited on the second ILD layer 1110b and the lower capacitor wire 1104l by, for example, CVD, PVD, ALD, some other deposition process, or a combination of the foregoing. In such embodiments, the third ILD layer 1110c is deposited on the etch stop layer.

Figure 20:
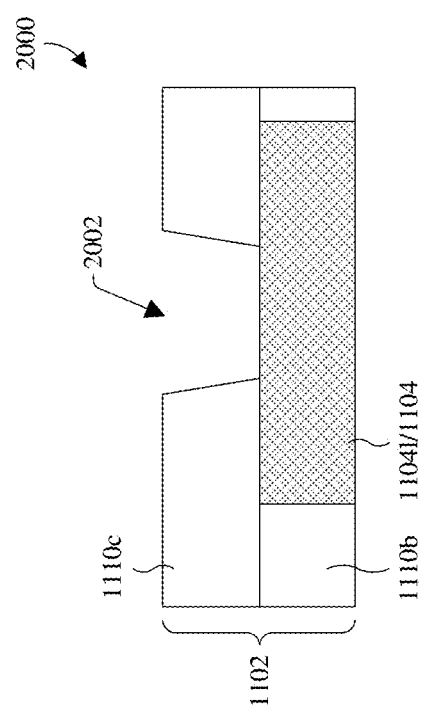

As shown in cross-sectional view 2000 of FIG. 20, the third ILD layer 1110c is patterned to form an opening 2002 overlying and exposing the lower capacitor wire 1104l. In some embodiments, a process for patterning the third ILD layer 1110c comprises forming a patterned masking layer (not shown) (e.g., positive/negative photoresist, a hardmask, etc.) on an upper surface of the third ILD layer 1110c. The patterned masking layer may be formed by forming a masking layer (not shown) on the upper surface of the third ILD layer 1110c (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the third ILD layer 1110c to selectively etch the third ILD layer 1110c according to the patterned masking layer. The etching process removes unmasked portions of the third ILD layer 1110c to form the opening 2002. In some embodiments, the etching process may be, for example, a wet etching process, a dry etching process, a reactive ion etching (RIE) process, some other etching process, or a combination of the foregoing.

Figure 21:
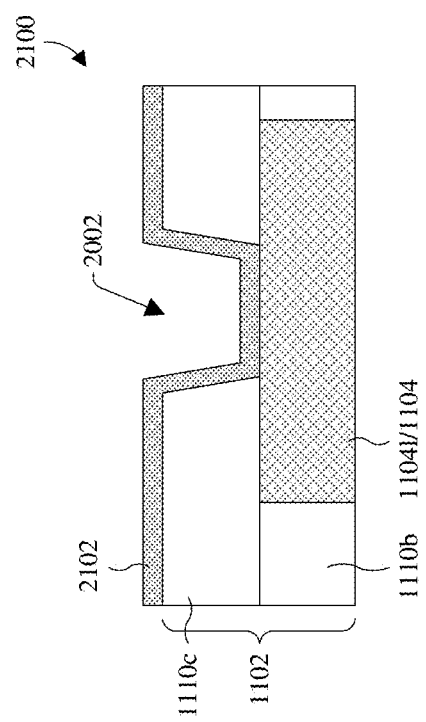

As shown in cross-sectional view 2100 of FIG. 21, a bottom electrode layer 2102 is deposited on the third ILD layer 1110c and lining the opening 2002. In some embodiments, the bottom electrode layer 2102 is deposited by, for example, ALD, CVD, PVD, electrochemical plating, electroless plating, sputtering, some other deposition process, or a combination of the foregoing. The bottom electrode layer 2102 is conductive and may be or comprise, for example, titanium (Ti), titanium nitride (TiN), tantalum (Ta), tantalum nitride (TaN), some other conductive material, or a combination of the foregoing.

Figure 22:
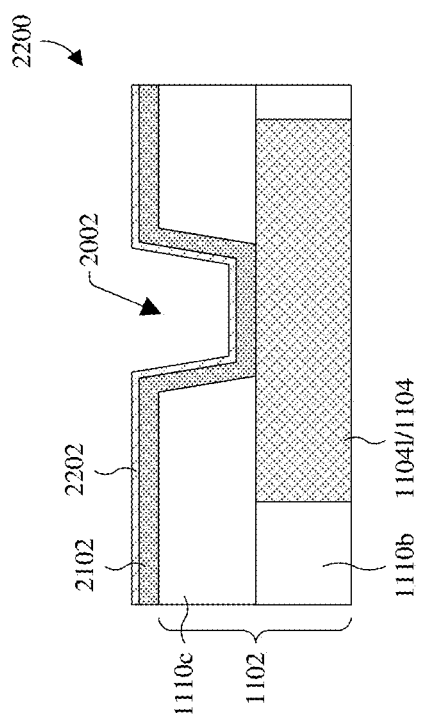

As shown in cross-sectional view 2200 of FIG. 22, a first interfacial layer 2202 is formed on the bottom electrode layer 2102. The first interfacial layer 2202 comprises a metal element (e.g., titanium (Ti), tantalum (Ta), etc.) and a non-metal element (e.g., nitrogen (N), oxygen (O), etc.). The bottom electrode layer 2102 comprises the metal element of the first interfacial layer 2202. In some embodiments, the first interfacial layer 2202 comprises the metal element, the non-metal element, and oxygen (O). For example, the bottom electrode layer 2102 is or comprises titanium nitride (TiN) and the first interfacial layer 2202 is or comprises titanium oxynitride (TiON).

The first interfacial layer 2202 may be formed by an oxidation process. For example, in some embodiments, the bottom electrode layer 2102 is formed in a processing chamber. After the bottom electrode layer 2102 is formed, the bottom electrode layer 2102 may be exposed to air (e.g., by transferring the bottom electrode layer 2102 and the structure underlying the bottom electrode layer 2102 out of the processing chamber). By exposing the bottom electrode layer 2102 to the air, the bottom electrode layer 2102 oxidizes, thereby resulting in the first interfacial layer 2202 growing from a top surface of the bottom electrode layer 2102. In some embodiments, after the first interfacial layer 2202 is formed on the bottom electrode layer 2102 by the oxidation process, one or more plasma treatment processes may be performed on the first interfacial layer 2202. In other embodiments, the first interfacial layer 2202 may be formed by a deposition process, for example, CVD, PVD, ALD, some other deposition process, or a combination of the foregoing.

Figure 23:
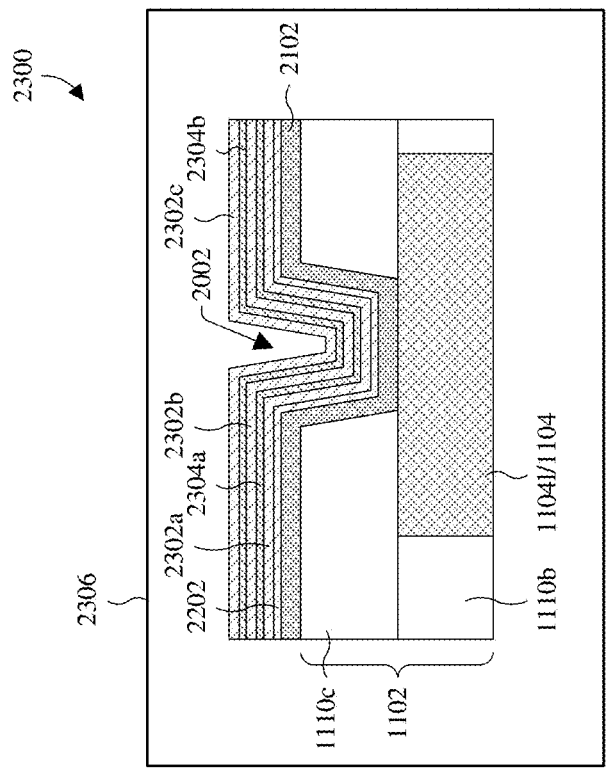

As shown in cross-sectional view 2300 of FIG. 23, a first plurality of dielectric layers 2302 and a second plurality of dielectric layers 2304 are formed over the first interfacial layer 2202 and the bottom electrode layer 2102. In some embodiments, the first interfacial layer 2202 is omitted. The first plurality of dielectric layers 2302 and the second plurality of dielectric layers 2304 are formed vertically stacked upon each other. Each of the first plurality of dielectric layers 2302 are formed separated from one another by one of the second plurality of dielectric layers 2304, and vice versa. For example, a first dielectric layer 2302a is formed on the first interfacial layer 2202, a second dielectric layer 2304a is formed on the first dielectric layer 2302a, a third dielectric layer 2302b is formed on the second dielectric layer 2304a, a fourth dielectric layer 2304b is formed on the third dielectric layer 2302b, and a fifth dielectric layer 2302c is formed on the fourth dielectric layer 2304b. In some embodiments, the first plurality of dielectric layers 2302 and a second plurality of dielectric layers 2304 are referred to as a stack of dielectric layers. It will be appreciated that, in some embodiments, a third plurality of dielectric layers (see, e.g., FIG. 10) may also be formed over the over the first interfacial layer 2202.

The first plurality of dielectric layers 2302 may, for example, be or comprise zirconium oxide ($ZrO_2$), aluminum oxide ($Al_2O_3$), hafnium oxide ($HfO_2$), tantalum oxide ($Ta_2O_5$), silicon dioxide ($SiO_2$), some other dielectric material, or any combination of the foregoing. In some embodiments, the first plurality of dielectric layers 2302 are or comprise a metal oxide (e.g., $ZrO_2$, $Al_2O_3$, $HfO_2$, $Ta_2O_5$, or the like) and/or are or comprise a high-k dielectric. The second plurality of dielectric layers 2304 may, for example, be or comprise zirconium oxide ($ZrO_2$), aluminum oxide ($Al_2O_3$), hafnium oxide ($HfO_2$), tantalum oxide ($Ta_2O_5$), silicon dioxide ($SiO_2$), some other dielectric material, or any combination of the foregoing. In some embodiments, the second plurality of dielectric layers 2304 are or comprise a metal oxide (e.g., $ZrO_2$, $Al_2O_3$, $HfO_2$, $Ta_2O_5$, or the like) and/or are or comprise a high-k dielectric. In some embodiments, the second plurality of dielectric layers 2304 are amorphous solids.

In some embodiments, the first plurality of dielectric layers 2302 comprise one or more crystals (e.g., 502 of FIG. 5). In some embodiments, the first plurality of dielectric layers 2302 comprise the one or more crystals, while the second plurality of dielectric layers 2304 are amorphous solids. In some embodiments, the crystalline lattices of the one or more crystals of the first plurality of dielectric layers 2302 are the same. For example, the one or more crystals of the first dielectric layer 2302a may comprise substantially the same percentages of monoclinic crystals, cubic crystals, and tetragonal crystals as both the third dielectric layer 2302b and the fifth dielectric layer 2302c.

In other embodiments, the crystalline lattices of the one or more crystals of the first dielectric layer 2302a and the fifth dielectric layer 2302c are substantially the same, while the crystalline lattices of the one or more crystals of the third dielectric layer 2302b are different. For example, the first dielectric layer 2302a and the fifth dielectric layer 2302c have substantially similar percentages of monoclinic crystals, cubic crystals, and/or tetragonal crystals, while the third dielectric structure 2302b has different percentages of monoclinic crystals, cubic crystals, and/or tetragonal crystals. More specifically, in some embodiments, the third dielectric layer 2302b has a lower percentage of tetragonal crystals than both the first dielectric layer 2302a and/or the fifth dielectric layer 2302c. For example, the one or more crystals of the third dielectric layer 2302b are less than or equal to about 20 wt % monoclinic crystals, less than or equal to about 20 wt % cubic crystals, and between about 40 wt % and 80 wt % tetragonal crystals, and the one or more crystals of both the first dielectric layer 2302a and the fifth dielectric layer 2302c are greater than 80 wt % tetragonal crystals.

In some embodiments, the first dielectric layer 2302a and the fifth dielectric layer 2302c are formed having a first thickness (e.g., 402 of FIG. 9). In further embodiments, the second dielectric layer 2304a and the fourth dielectric layer 2304b are formed having a second thickness (e.g., 404 of FIG. 9). In yet further embodiments, the third dielectric layer 2302b is formed having a third thickness (e.g., 904 of FIG. 9). The first thickness may be between about 10 angstroms (Å) and about 35 Å. The second thickness is less than the first thickness. The second thickness is greater than about 5 Å. The third thickness may be between about 10 Å and about 35 Å. In some embodiments, the third thickness and the first thickness are substantially the same. In other embodiments, the third thickness is different than the first thickness. For example, in some embodiments, the third thickness is less than the first thickness.

In some embodiments, the first plurality of dielectric layers 2302 and the second plurality of dielectric layers 2304 are formed by one or more deposition processes (e.g., CVD, PVD, ALD, etc.). For example, in some embodiments, the first plurality of dielectric layers 2302 and the second plurality of dielectric layers 2304 are formed in a processing chamber 2306 by an ALD process. The ALD process forms the first plurality of dielectric layers 2302 and the second plurality of dielectric layers 2304 in-situ (e.g., without breaking the vacuum of the processing chamber 2306). For example, the ALD process forms the first plurality of dielectric layers 2302 and the second plurality of dielectric layers 2304 in-situ by loading the structure illustrated in FIG. 22 (and its underlying features (see, e.g., FIG. 18)) into the processing chamber 2306 and then pumping down the processing chamber 2306 (e.g., to form a vacuum in the processing chamber 2306). Thereafter, a first set of precursors for depositing the first plurality of dielectric layers 2302 and a second set of precursors for depositing the second plurality of dielectric layers 2304 are cyclically pumped into the processing chamber 2306, thereby forming the first plurality of dielectric layers 2302 and the second plurality of dielectric layers 2304. It will be appreciated that, in some embodiments, one or more purging/evacuating steps may be performed between deposition of the first plurality of dielectric layers 2302 and the second plurality of dielectric layers 2304 (e.g., purging the processing chamber 2306 between forming the first dielectric layer 2302a and the second dielectric layer 2304a, between forming the second dielectric layer 2304a and the third dielectric layer 2302b, and so forth).

Figure 24:
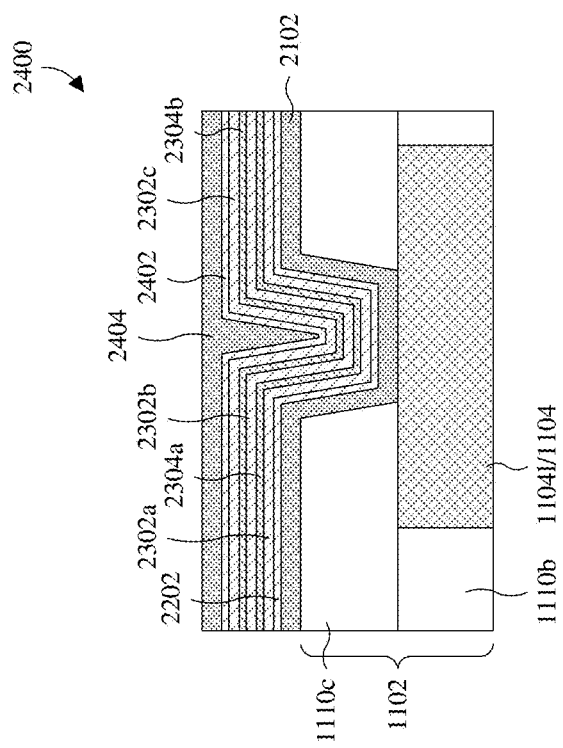

As shown in cross-sectional view 2400 of FIG. 24, a second interfacial layer 2402 is formed over the fifth dielectric layer 2302c. In some embodiments, a process for forming the second interfacial layer 2402 comprises depositing the second interfacial layer 2402 on the fifth dielectric layer 2302c. The second interfacial layer 2402 may be deposited by, for example, CVD, PVD, ALD, sputtering, some other deposition process, or a combination of the foregoing.

Also shown in the cross-sectional view 2400 of FIG. 24, a top electrode layer 2404 is formed over the second interfacial layer 2402 and the fifth dielectric layer 2302c. In some embodiments, a process for forming the top electrode layer 2404 comprises depositing the top electrode layer 2404 on the second interfacial layer 2402. The top electrode layer 2404 may be deposited by, for example, CVD, PVD, ALD, electrochemical plating, electroless plating, sputtering, some other deposition process, or a combination of the foregoing. In some embodiments, the second interfacial layer 2402 is omitted. In such embodiments, the top electrode layer 2404 may be deposited on the fifth dielectric layer 2302c. In some embodiments, the second interfacial layer 2402 and/or the top electrode layer 2404 may be formed in the processing chamber 2306. In further embodiments, the second interfacial layer 2402 and/or the top electrode layer 2404 may also be formed in-situ with the first plurality of dielectric layers 2302 and the second plurality of dielectric layers 2304. In other embodiments, the second interfacial layer 2402 and/or the top electrode layer 2404 may be formed in a different processing chamber than the processing chamber 2306.

The top electrode layer 2404 is conductive and may be or comprise, for example, titanium (Ti), titanium nitride (TiN), tantalum (Ta), tantalum nitride (TaN), some other conductive material, or a combination of the foregoing. The top electrode layer 2404 and the bottom electrode layer 2102 may be a same material. The second interfacial layer 2402 comprises a metal element (e.g., titanium (Ti), tantalum (Ta), etc.) and a non-metal element (e.g., nitrogen (N), oxygen (O), etc.). The top electrode layer 2404 comprises the metal element of the second interfacial layer 2402. In some embodiments, the second interfacial layer 2402 comprises the metal element, the non-metal element, and oxygen (O). For example, the top electrode layer 2404 is or comprises titanium nitride (TiN), and the second interfacial layer 2402 is or comprises titanium oxynitride (TiON).

In some embodiments, the second interfacial layer 2402 and the first interfacial layer 2202 are formed with a same electron affinity. In further embodiments, the bottom electrode layer 2102 and the top electrode layer 2404 are formed with a same work function. In further embodiments, the second dielectric layer 2304a and the fourth dielectric layer 2304b are formed with a same electron affinity. In further embodiments, the first dielectric layer 2302a and the fifth dielectric layer 2302c are formed with a same electron affinity. In yet further embodiments, the first dielectric layer 2302a, the third dielectric layer 2302b, and the fifth dielectric layer 2302c are formed with a same electron affinity. In other embodiments, the third dielectric layer 2302b is formed with a different electron affinity that the first dielectric layer 2302a and/or the fifth dielectric layer 2302c.

Figure 25:
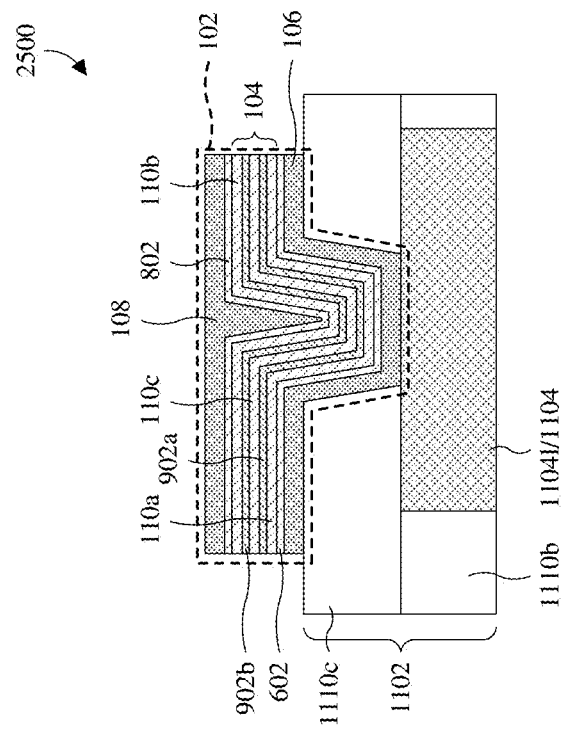

As shown in cross-sectional view 2500 of FIG. 25, the top electrode layer 2404 (see, e.g., FIG. 24), the second interfacial layer 2402 (see, e.g., FIG. 24), the first plurality of dielectric layers 2302 (see, e.g., FIG. 24), the second plurality of dielectric layers 2304 (see, e.g., FIG. 24), the first interfacial layer 2202 (see, e.g., FIG. 24), and the bottom electrode layer 2102 (see, e.g., FIG. 24) are patterned to form a MIM capacitor 102 overlying the lower capacitor wire 1104l. In some embodiments, the MIM capacitor 102 comprises a bottom electrode 106, a first capacitor interfacial layer 602, a capacitor insulator structure 104, a second capacitor interfacial layer 802, and a top electrode 108 vertically stacked. The capacitor insulator structure 104 is symmetrical. In some embodiments, the capacitor insulator structure 104 comprises a first dielectric structure 110a, a fifth dielectric structure 902a, a fourth dielectric structure 110c, a sixth dielectric structure 902b, and a second dielectric structure 110b vertically stacked.

In some embodiments, the patterning process for forming the MIM capacitor 102 comprises forming a patterned masking layer (not shown) (e.g., positive/negative photoresist, a hardmask, etc.) on an upper surface of the top electrode layer 2404. Thereafter, with the patterned masking layer in place, an etching process is performed on the top electrode layer 2404, the second interfacial layer 2402, the first plurality of dielectric layers 2302, the second plurality of dielectric layers 2304, the first interfacial layer 2202, and the bottom electrode layer 2102 to selectively etch such layers according to the patterned masking layer. The etching process removes unmasked portions of the top electrode layer 2404 to from the top electrode 108, unmasked portions of the second interfacial layer 2402 to form the second capacitor interfacial layer 802, unmasked portions of the fifth dielectric layer 2302c to form the second dielectric structure 110b, unmasked portions of the fourth dielectric layer 2304b to form the sixth dielectric structure 902b, unmasked portions of the third dielectric layer 2302b to form the fourth dielectric structure 110c, unmasked portions of the second dielectric layer 2304a to form the fifth dielectric structure 902a, unmasked portions of the first dielectric layer 2302a to form the first dielectric structure 110a, unmasked portions of the first interfacial layer 2202 to form the first capacitor interfacial layer 602, and unmasked portions of the bottom electrode layer 2102 to from the bottom electrode 106. In some embodiments, the etching process may be, for example, a wet etching process, a dry etching process, a RIE process, some other etching process, or a combination of the foregoing.

Figure 26:
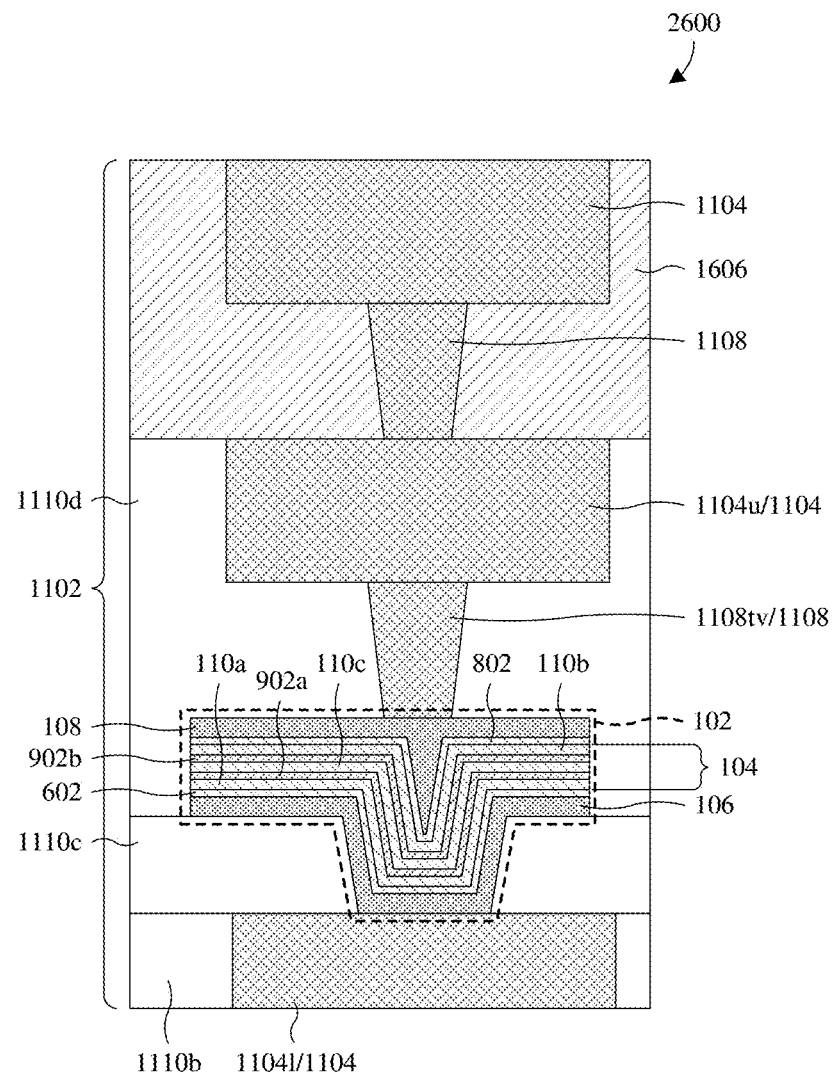

As shown in cross-sectional view 2600 of FIG. 26, the interconnect structure 1102 is completed around the MIM capacitor 102. Upon completion, the interconnect structure 1102 comprises a fourth ILD layer 1110d overlying the MIM capacitor 102 and further comprises a passivation layer 1606 overlying the fourth ILD layer 1110d. Further, the interconnect structure 1102 comprises a plurality of additional wires 1104 and a plurality of additional vias 1108 in the fourth ILD layer 1110d and the passivation layer 1606. The plurality of additional wires 1104 comprises an upper capacitor wire 1104u, and the plurality of additional vias 1108 comprises a TEVA 1108tv extending from the upper capacitor wire 1104u to the top electrode 108.

FIG. 27 illustrates a flowchart 2700 of some embodiments of a method for forming an IC comprising a MIM capacitor having a capacitor insulator structure that is symmetrical. While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phase.

At act 2702, a first interlayer dielectric (ILD) layer is formed overlying a second ILD layer and a lower capacitor wire, where the second ILD layer and the lower capacitor wire are disposed over a substrate. FIGS. 18-19 illustrate a series of cross-sectional views 1800-1900 of some embodiments corresponding to act 2702.

At act 2704, an opening is formed in the first ILD layer that exposes the lower capacitor wire. FIG. 20 illustrates a cross-sectional view 2000 of some embodiments corresponding to act 2704.

At act 2706, a bottom electrode layer is formed over the first ILD layer and lining the opening. FIG. 21 illustrates a cross-sectional view 2100 of some embodiments corresponding to act 2706.

At act 2708, a stack of dielectric layers is formed over the bottom electrode layer, where a bottom half of the stack of dielectric layers is a mirror image of a top half of the stack of dielectric layers in terms of material and/or material thickness. FIGS. 22-23 illustrate a series of cross-sectional views 2200-2300 of some embodiments corresponding to act 2708.

At act 2710, a top electrode layer is formed over the stack of dielectric layers. FIG. 24 illustrates a cross-sectional view 2400 of some embodiments corresponding to act 2710.

At act 2712, the top electrode layer, the stack of dielectric layers, and the bottom electrode layer are patterned into a metal-insulator-metal (MIM) capacitor. FIG. 25 illustrates a cross-sectional view 2500 of some embodiments corresponding to act 2712.

In some embodiments, the present disclosure provides a metal-insulator-metal (MIM) capacitor. The MIM capacitor comprises a bottom electrode disposed over a semiconductor substrate. A top electrode overlies the bottom electrode. A capacitor insulator structure is disposed between the bottom electrode and the top electrode. The capacitor insulator structure comprises a first plurality of dielectric structures comprising a first dielectric material. The capacitor insulator structure comprises a second plurality of dielectric structures comprising a second dielectric material different than the first dielectric material. The capacitor insulator structure alternates periodically between the first and second dielectric materials from the bottom electrode to the top electrode. The first plurality of dielectric structures comprises a first dielectric structure, a second dielectric structure, and a third dielectric structure. The second dielectric structure is disposed between the first dielectric structure and the third dielectric structure. The second dielectric structure has a lower percent by weight (wt %) of tetragonal crystals than the first dielectric structure and the third dielectric structure.

In some embodiments, the present disclosure provides another metal-insulator-metal (MIM) capacitor. The MIM capacitor comprises a lower electrode disposed over a semiconductor substrate. An upper electrode overlies the lower electrode. A capacitor insulator structure is disposed between the lower electrode and the upper electrode. The capacitor insulator structure comprises a stack of dielectric structures comprising at least five individual dielectric structures vertically stacked upon each other. The individual dielectric structures comprise a first individual dielectric structure comprising a first dielectric material and a second individual dielectric structure comprising the first dielectric material. The first individual dielectric structure is an uppermost individual dielectric structure of the stack of dielectric structures. The second individual dielectric structure is a lowermost individual dielectric structure of the stack of dielectric structures. The individual dielectric structures that are disposed between the first individual dielectric structure and the second individual dielectric structure comprise the first dielectric material, a second dielectric material, or a third dielectric material. The second dielectric material is different than the first dielectric material. The third dielectric material is different than the first dielectric material and the second dielectric material. The individual dielectric structures that are disposed between the first individual dielectric structure and the second individual dielectric structure alternate periodically among the first, second, and third dielectric materials from the second individual dielectric structure to the first individual dielectric structure.

In some embodiments, the present application provides a method for forming a metal-insulator-metal (MIM) capacitor. The method comprises forming a bottom electrode layer over a semiconductor substrate. A first dielectric layer comprising a first dielectric material is formed over the bottom electrode layer, wherein the first dielectric layer is formed with a first percent by weight (wt %) of tetragonal crystals. A second dielectric layer comprising a second dielectric material different than the first dielectric material is formed over the first dielectric layer, wherein the second dielectric layer is formed as an amorphous solid. A third dielectric layer comprising the first dielectric material is formed over the second dielectric layer, wherein the third dielectric layer is formed with a second wt % of tetragonal crystals. A fourth dielectric layer comprising the second dielectric material is formed over the third dielectric layer, wherein the fourth dielectric layer is formed as an amorphous solid. A fifth dielectric layer comprising the first dielectric material is formed over the fourth dielectric layer, wherein the fifth dielectric layer is formed with a third wt % of tetragonal crystals, wherein the second wt % of tetragonal crystals is less than the first wt % of tetragonal crystals and the third wt % of tetragonal crystals. A top electrode layer is formed over the fifth dielectric layer. The top electrode layer, the fifth dielectric layer, the fourth dielectric layer, the third dielectric layer, the second dielectric layer, the first dielectric layer, and the bottom electrode layer are patterned to form the MIM capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor comprising:
a bottom electrode disposed over a semiconductor substrate;
a top electrode overlying the bottom electrode; and
a capacitor insulator structure disposed between the bottom electrode and the top electrode, wherein:
the capacitor insulator structure comprises a first plurality of dielectric structures comprising a first dielectric material;
the capacitor insulator structure comprises a second plurality of dielectric structures comprising a second dielectric material different than the first dielectric material;
the capacitor insulator structure alternates periodically between the first and second dielectric materials from the bottom electrode to the top electrode;
the first plurality of dielectric structures comprises a first dielectric structure, a second dielectric structure, and a third dielectric structure;
the second dielectric structure is disposed between the first dielectric structure and the third dielectric structure; and
the second dielectric structure has a lower percent by weight (wt %) of tetragonal crystals than the first dielectric structure and the third dielectric structure.

2. The MIM capacitor of claim 1, wherein:
the first dielectric structure is disposed nearer the bottom electrode than any other of the first plurality of dielectric structures and nearer the bottom electrode than any of the second plurality of dielectric structures; and
the third dielectric structure is disposed nearer the top electrode than any other of the first plurality of dielectric structures and nearer the top electrode than any of the second plurality of dielectric structures.

3. The MIM capacitor of claim 2, wherein the first dielectric material has a larger electron affinity than the second dielectric material.

4. The MIM capacitor of claim 3, wherein:
the second dielectric structure has between 40 wt % and 80 wt % of tetragonal crystals, less than or equal to 20 wt % of monoclinic crystals, and less than or equal to 20 wt % of cubic crystals.

5. The MIM capacitor of claim 4, wherein:
the first dielectric material comprises zirconium oxide; and
the second dielectric material comprises aluminum oxide.

6. The MIM capacitor of claim 1, wherein:
the first plurality of dielectric structures each have a first thickness that is greater than or equal to about 6 angstroms; and
the second plurality of dielectric structures each have a second thickness that is greater than or equal to about 6 angstroms.

7. The MIM capacitor of claim 6, wherein the first thickness is greater than the second thickness.

8. The MIM capacitor of claim 1, wherein:
the first dielectric structure and the third dielectric structure each have a first thickness;
the second dielectric structure has a second thickness; and
the second thickness is less than the first thickness.

9. The MIM capacitor of claim 8, wherein the second plurality of dielectric structures each have a third thickness that is less than the second thickness.

10. The MIM capacitor of claim 9, wherein:
the second dielectric structure has between 40 wt % and 80 wt % of tetragonal crystals, less than or equal to 20 wt % of monoclinic crystals, and less than or equal to 20 wt % of cubic crystals.

11. The MIM capacitor of claim 10, wherein the second plurality of dielectric structures are amorphous solids.

12. The MIM capacitor of claim 11, wherein:
the first thickness is between about 21 angstroms and about 35 angstroms;
the second thickness is between about 10 angstroms and about 20 angstroms; and
the third thickness is greater than about 6 angstroms.

13. The MIM capacitor of claim 1, wherein:
the bottom electrode comprises a metal element and a non-metal element;
the MIM capacitor comprises a first capacitor interfacial layer disposed between and directly contacting the capacitor insulator structure and the bottom electrode; and
the first capacitor interfacial layer comprises the metal element, the non-metal element, and oxygen.

14. The MIM capacitor of claim 13, wherein:
the top electrode comprises the metal element and the non-metal element;
the MIM capacitor comprises a second capacitor interfacial layer disposed between and directly contacting the capacitor insulator structure and the top electrode; and
the second capacitor interfacial layer comprises the metal element, the non-metal element, and oxygen.

15. A metal-insulator-metal (MIM) capacitor comprising:
a lower electrode disposed over a semiconductor substrate;
a capacitor interfacial layer overlying the lower electrode, wherein the capacitor interfacial layer is a different material than the lower electrode;
an upper electrode overlying the lower electrode and the capacitor interfacial layer; and
a capacitor insulator structure disposed vertically between the capacitor interfacial layer and the upper electrode, wherein:
the capacitor insulator structure comprises a stack of individual dielectric structures that are vertically stacked upon each other;
the stack of individual dielectric structures comprises a first individual dielectric structure comprising a first dielectric material, a second individual dielectric structure comprising the first dielectric material, and a third individual dielectric structure comprising a second dielectric material different than the first dielectric material;
the first individual dielectric structure is an uppermost individual dielectric structure of the stack of individual dielectric structures;
the second individual dielectric structure is a lowermost individual dielectric structure of the stack of individual dielectric structures;
the third individual dielectric structure vertically separates the first individual dielectric structure from the second individual dielectric structure; and
the third individual dielectric structure has a lower percent by weight (wt %) of tetragonal crystals than the first individual dielectric structure and the second individual dielectric structure.

16. An integrated chip (IC) comprising:
a metal-insulator-metal (MIM) capacitor comprising:
a lower electrode disposed over a semiconductor substrate;

an upper electrode disposed over the lower electrode; and a capacitor insulator structure disposed vertically between the upper electrode and the lower electrode, wherein:

the capacitor insulator structure comprises a stack of dielectric structures;

a lowermost dielectric structure of the stack of dielectric structures comprises a first dielectric material;

an uppermost dielectric structure of the stack of dielectric structures comprises the first dielectric material;

an intermediate dielectric structure of the stack of dielectric structures is disposed vertically between the lowermost dielectric structure and the uppermost dielectric structure;

the intermediate dielectric structure comprises a second dielectric material that is different than the first dielectric material; and the intermediate dielectric structure has a lower percent by weight (wt %) of tetragonal crystals than the lowermost dielectric structure and the uppermost dielectric structure.

17. The IC of claim 16, wherein:

an electron affinity of the lowermost dielectric structure is substantially the same as the electron affinity of the uppermost dielectric structure.

18. The IC of claim 16, wherein:

the lowermost dielectric structure directly contacts the lower electrode; and the uppermost dielectric structure directly contacts the upper electrode.

19. The IC of claim 16, further comprising:

an interlayer dielectric (ILD) layer disposed over the semiconductor substrate, wherein the MIM capacitor is disposed in the ILD layer and vertically spaced from the semiconductor substrate.

20. The IC of claim 19, wherein:

the lower electrode has a first lower surface and a second lower surface;

the second lower surface is disposed vertically between the semiconductor substrate and the first lower surface; and a sidewall of the lower electrode protrudes downwardly from the first lower surface to the second lower surface.

* * * * *